(12) United States Patent
Zaveri et al.

(10) Patent No.: US 6,897,678 B2
(45) Date of Patent: May 24, 2005

(54) PROGRAMMABLE LOGIC DEVICE WITH CIRCUITRY FOR OBSERVING PROGRAMMABLE LOGIC CIRCUIT SIGNALS AND FOR PRELOADING PROGRAMMABLE LOGIC CIRCUITS

(75) Inventors: Ketan Zaveri, San Jose, CA (US); Christopher F. Lane, Campbell, CA (US); Srinivas T. Reddy, Fremont, CA (US); Andy L. Lee, San Jose, CA (US); Cameron R. McClintock, Mountain View, CA (US); Bruce B. Pedersen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 391 days.

(21) Appl. No.: 10/255,661

(22) Filed: Sep. 25, 2002

(65) Prior Publication Data

US 2003/0033584 A1 Feb. 13, 2003

Related U.S. Application Data

(62) Division of application No. 09/608,061, filed on Jun. 29, 2000, now Pat. No. 6,481,000, which is a continuation of application No. 09/082,867, filed on May 21, 1998, now Pat. No. 6,157,210.
(60) Provisional application No. 60/062,079, filed on Oct. 16, 1997.

(51) Int. Cl.$^7$ .......................................... H03K 19/177
(52) U.S. Cl. ........................... 326/39; 326/16; 326/40; 714/724; 716/16; 716/17
(58) Field of Search .............................. 326/38–41, 16; 716/16–18; 714/724–726

(56) References Cited

U.S. PATENT DOCUMENTS

| | | | |
|---|---|---|---|
| 4,423,509 A | 12/1983 | Feissel | |
| 4,484,329 A | 11/1984 | Slamka et al. | |
| 4,556,840 A | 12/1985 | Russell | |

(Continued)

OTHER PUBLICATIONS

Hu, S.C., "Cellular Synthesis of Synchronous Sequential Machines," *IEEE Transactions on Computers*, vol. C–21, No. 12, pp. 1399–1405 (Dec. 1972).
Page, III, E.W., "Programmable Array Realization of Sequential Machines," Doctoral Dissertation, Dept. of Electrical Engineering, Duke University (May 10, 1973).

(Continued)

*Primary Examiner*—Vibol Tan
(74) *Attorney, Agent, or Firm*—Fish & Neave IP Group of Ropes & Gray LLP; Robert R. Jackson

(57) ABSTRACT

A programmable logic device is provided that contains circuitry that may be used for observing logic signals from programmable logic circuits on the device for testing the operation of the device. Circuitry is also provided that may be used for preloading data into various circuits on the device. The logic signal observing circuitry may allow registered signals to be observed, may allow combinatorial signals to be observed, or may allow both registered and combinatorial signals to be observed.

14 Claims, 40 Drawing Sheets

U.S. PATENT DOCUMENTS

| | | | |
|---|---|---|---|
| 4,580,137 A | | 4/1986 | Fiedler et al. |
| 4,649,539 A | | 3/1987 | Crain et al. |
| 4,701,920 A | | 10/1987 | Resnick et al. |
| 4,701,921 A | | 10/1987 | Powell et al. |
| 4,706,216 A | | 11/1987 | Carter |
| 4,780,666 A | | 10/1988 | Sakashita et al. |
| 4,856,002 A | | 8/1989 | Sakashita et al. |
| 4,862,068 A | | 8/1989 | Kawashima et al. |
| 4,864,579 A | | 9/1989 | Kishida et al. |
| 4,873,459 A | | 10/1989 | El Gamal et al. |
| 4,879,688 A | | 11/1989 | Turner et al. |
| 4,896,216 A | | 1/1990 | Brunst et al. |
| 4,912,709 A | | 3/1990 | Teske et al. |
| 4,914,379 A | | 4/1990 | Maeno |
| 4,947,395 A | | 8/1990 | Bullinger et al. |
| 4,975,641 A | | 12/1990 | Tanaka et al. |
| 5,003,204 A | | 3/1991 | Cushing et al. |
| 5,008,618 A | | 4/1991 | Van Der Star |
| 5,027,355 A | | 6/1991 | Stoica |
| 5,047,710 A | | 9/1991 | Mahoney |
| 5,159,598 A | | 10/1992 | Welles, II et al. |
| 5,237,219 A | | 8/1993 | Cliff |
| 5,297,103 A | | 3/1994 | Higuchi |
| 5,371,422 A | | 12/1994 | Patel et al. |
| 5,457,651 A | | 10/1995 | Rouy |
| 5,543,730 A | | 8/1996 | Cliff et al. |
| 5,570,317 A | | 10/1996 | Rosen et al. |
| 5,581,198 A | | 12/1996 | Trimberger |
| 5,801,546 A | * | 9/1998 | Pierce et al. .................. 326/39 |
| 5,812,469 A | | 9/1998 | Nadeau-Dostie et al. |
| 5,821,773 A | | 10/1998 | Norman et al. |
| 5,870,410 A | | 2/1999 | Norman et al. |
| 5,936,976 A | | 8/1999 | Story et al. |
| 6,080,203 A | * | 6/2000 | Njinda et al. .................. 716/4 |
| 6,226,779 B1 | * | 5/2001 | Baxter et al. .................. 716/16 |
| 6,243,304 B1 | * | 6/2001 | Patel et al. ............ 365/189.08 |
| 6,721,923 B2 | * | 4/2004 | Fisher ........................... 716/1 |
| 6,829,751 B1 | * | 12/2004 | Shen et al. ..................... 716/4 |

OTHER PUBLICATIONS

H. Bleeker et al., *Boundary–Scan Test; A Practical Approach*, Kluwer Academic Publishers, Dordrecht, 1993, p. 21.

"IEEE Standard Test Access Port and Boundary–Scan Architecture," IEEE Std 1149.1–1990 (Includes IEEE Std 1149.1a–1993), Institute of Electrical and Electronics Engineers, Inc., New York, N.Y., Oct. 21, 1993.

"FLEXlogic Application Support Manual, A Collection of Application Notes," Intel Corporation, Dec. 1993.

C. Brown, "Overview of In–Circuit Reconfiguration and Reprogramming for the FLEXlogic iFX8160," Intel Corporation, Mar. 1994.

Lattice In–System Programmability Manual 1994, Lattice Semiconductor Corporation.

Lattice Handbook 1994, Lattice Semiconductor Corporation.

* cited by examiner

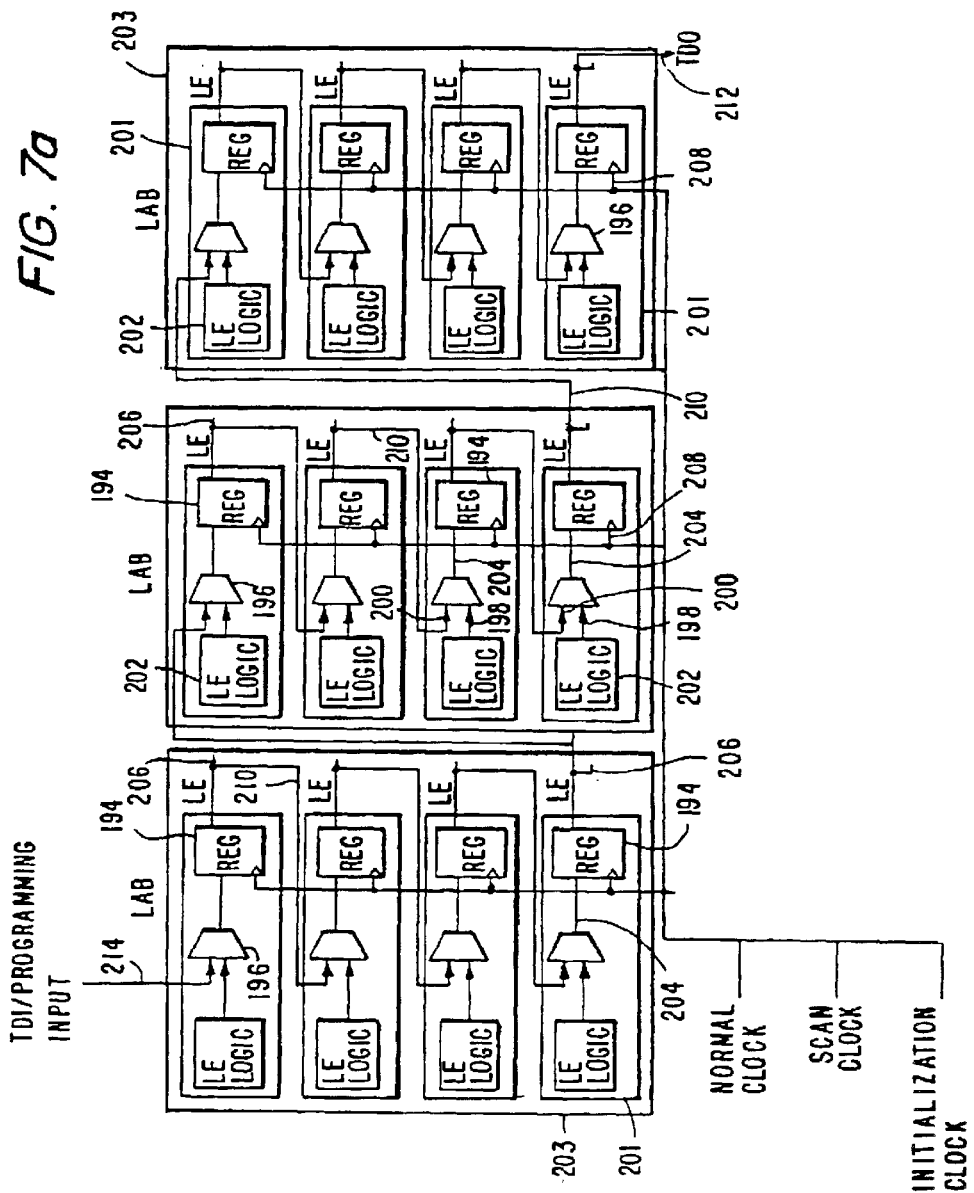

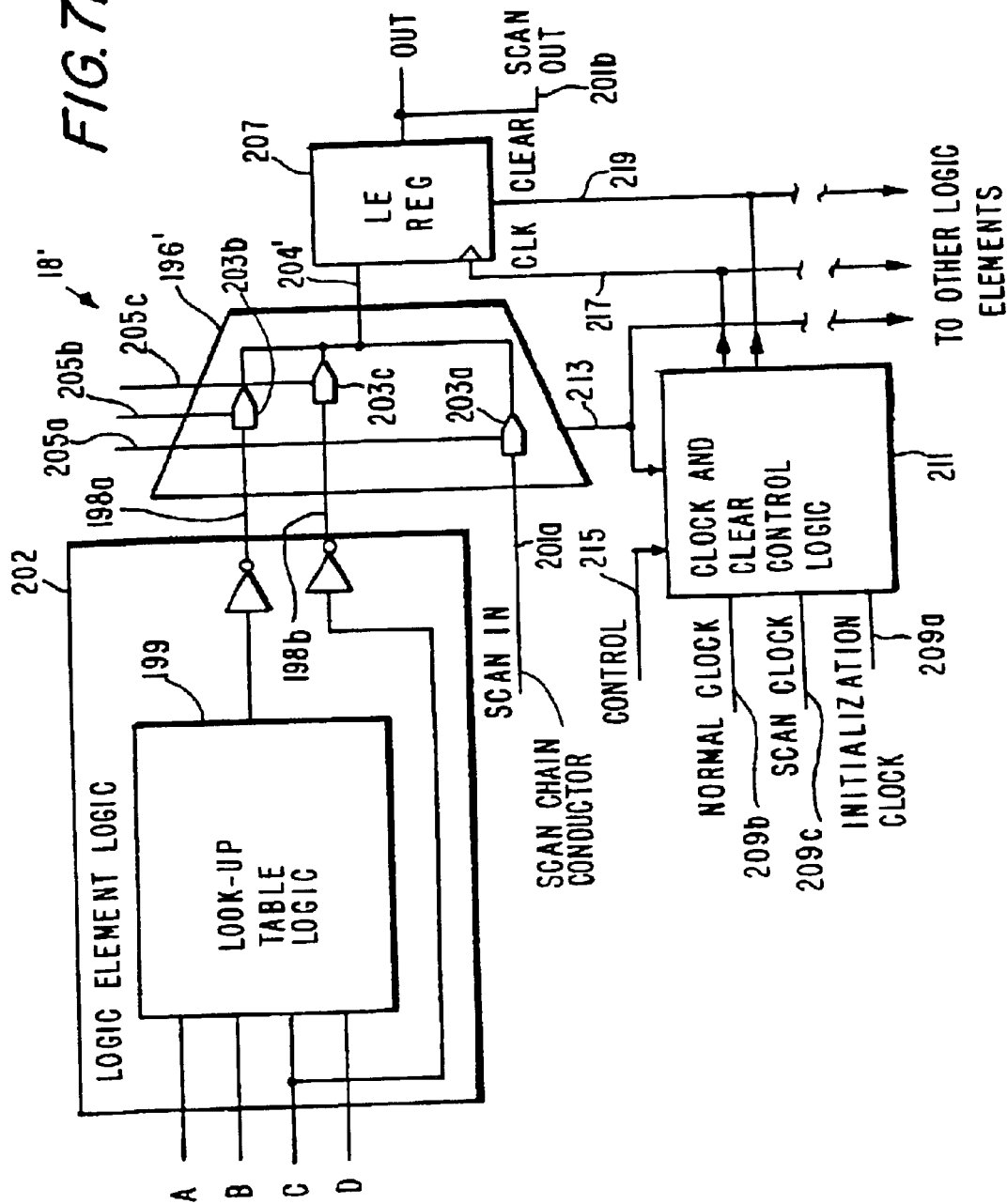

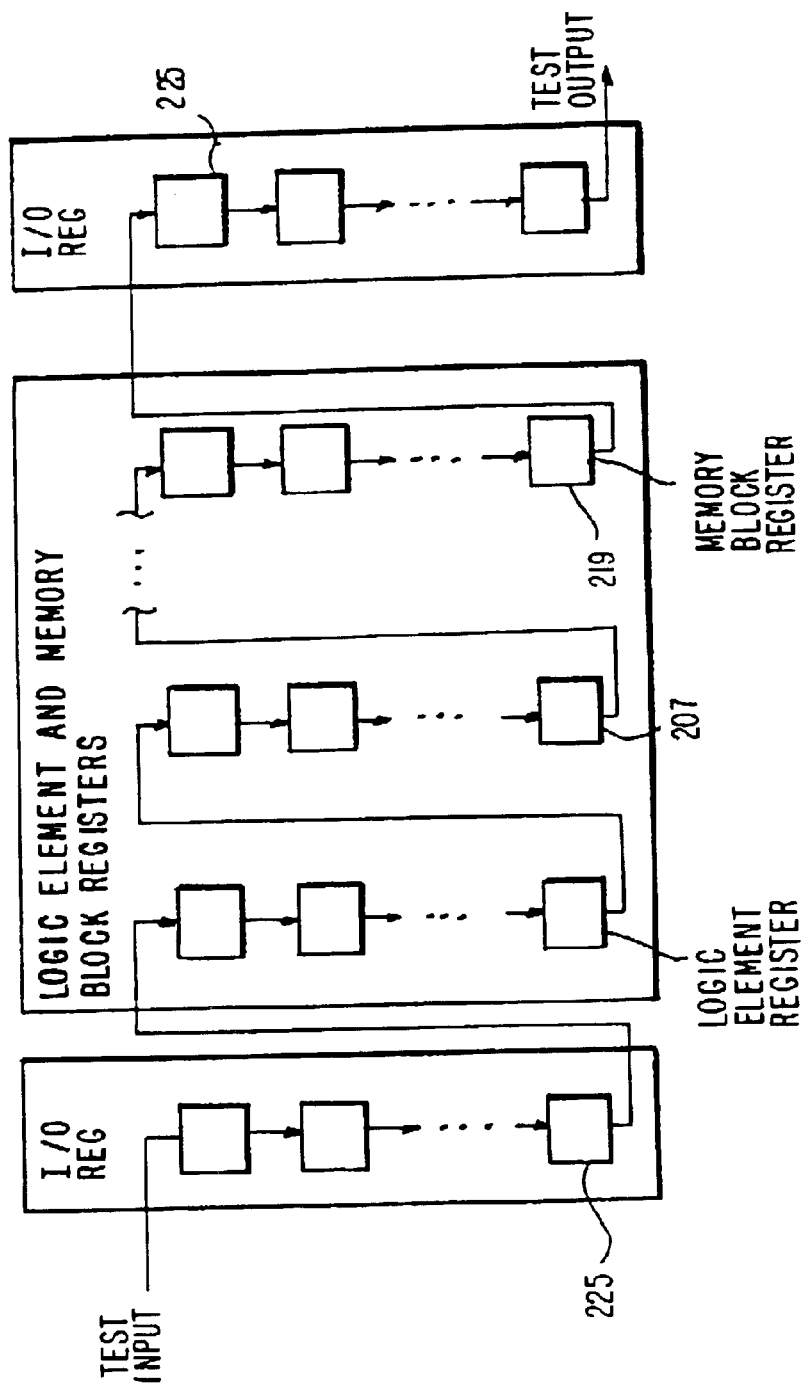

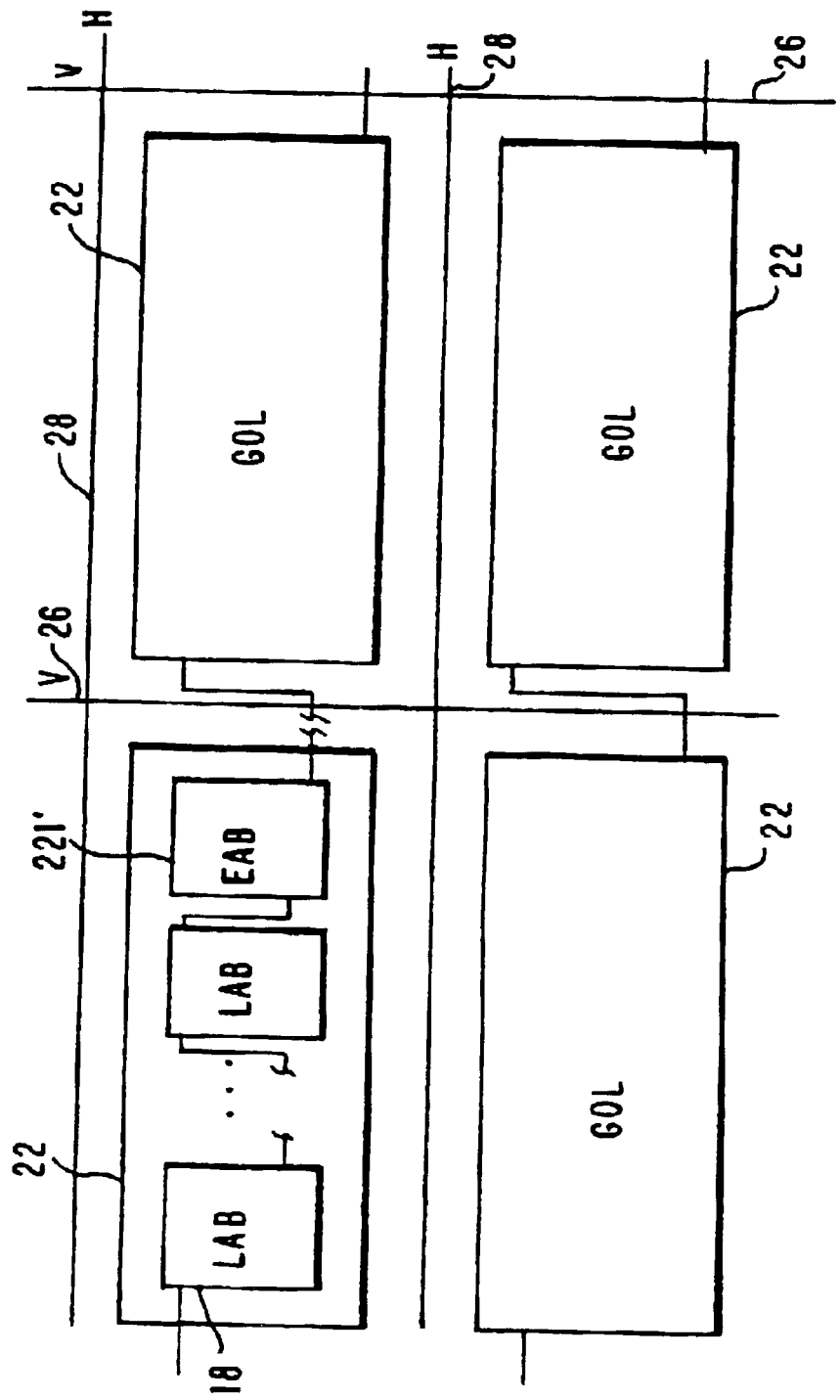

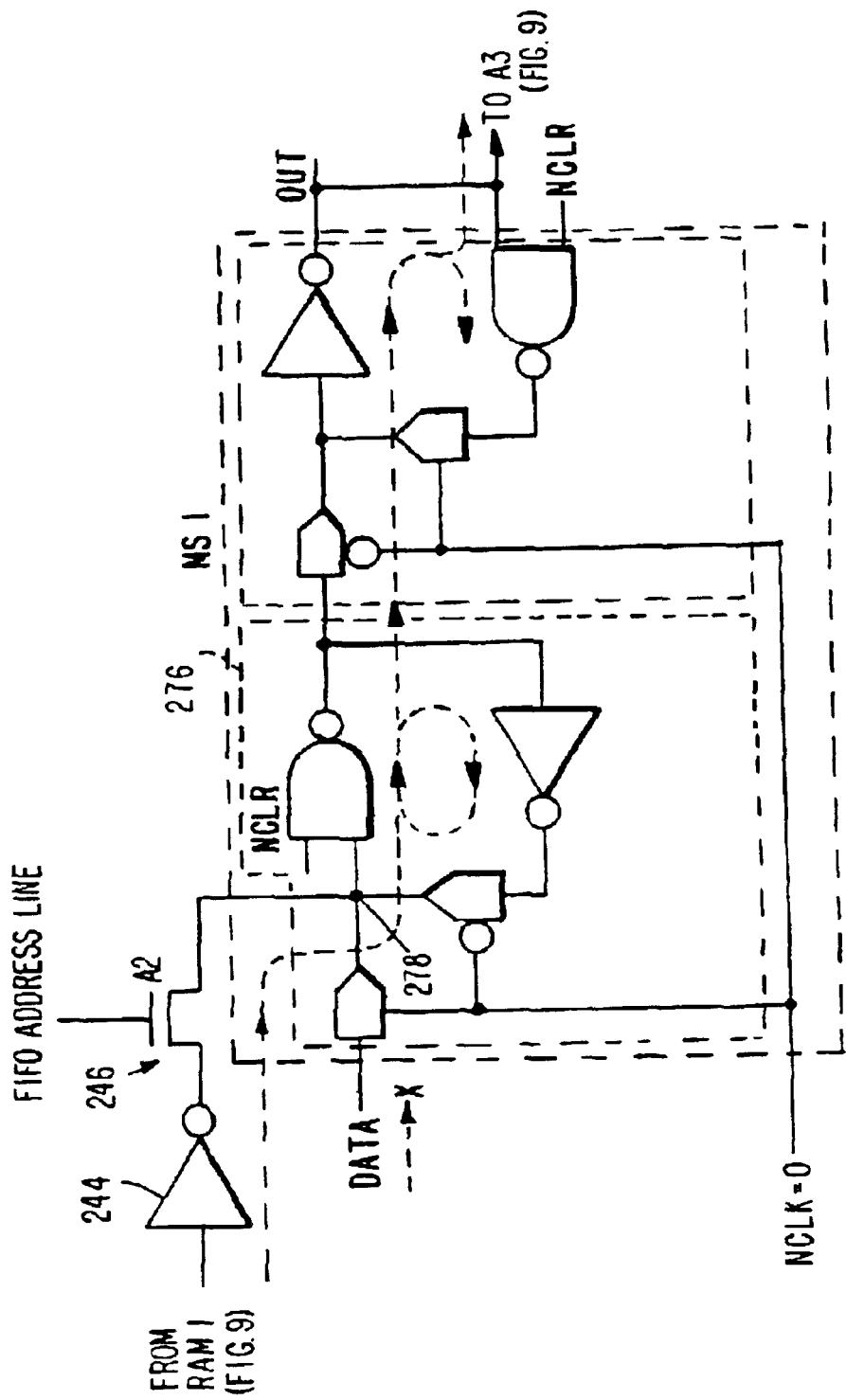

| T | 0 | 1 | 2 | 3 | 4 | 5 | 6 | ... | 10 | 11 | 12 | 13 | 14 | 15 |
|---|---|---|---|---|---|---|---|---|---|---|---|---|---|---|
| A1 | 1 | 1 | 1 | 1 | 0 | 0 | 0 | | 0 | 0 | 0 | 0 | 0 | 1 |
| A2 | 1 | 1 | 1 | 0 | 0 | 0 | 0 | | 0 | 0 | 0 | 0 | 1 | 1 |
| A3 | 1 | 1 | 0 | 0 | 0 | 0 | 0 | | 0 | 0 | 0 | 1 | 1 | 1 |
| NCLR | 1 | 1 | 1 | 1 | 1 | x | x | | x | 1 | 1 | 1 | 1 | 1 |
| NCLK | x | 0 | 0 | 0 | 0 | x | x | | x | 0 | 0 | 0 | 0 | 0 |
| RAM1 | x | x | x | D1 | D1 | D1 | D1 | | D1 | D1 | D1 | D1 | D1 | x |
| MS1 | x | x | D2 | D2 | D2 | D2 | x | | D2' | D2' | D2' | D2' | D1 | x |
| RAM2 | x | D3 | D3 | D3 | D3 | D3 | D3 | | D3 | D3 | D3 | D2' | D1 | x |
| VERIFY NODE | x | x | D3 | D3 | D3 | D3 | D3 | | D3 | D3 | D3 | D2' | D1 | x |

FIG.12

| USER CLOCK | POSITIVE EDGE TRIGGERED | | | NEGATIVE EDGE TRIGGERED | | |
|---|---|---|---|---|---|---|
| | NCLK @ REG | DATA LOSS ENTERING USER MODE? | DATA LOSS ENTERING VERIFY MODE? | NCLK @ REG | DATA LOSS ENTERING USER MODE | DATA LOSS ENTERING VERIFY MODE |
| HIGH | LOW | L→L NO | L→L NO | HIGH | L→H NO | H→L YES |
| LOW | HIGH | L→H NO | H→L YES | LOW | L→L NO | L→L NO |

FIG. 13

| T | 0 | 1 | 2 | 3 | 4 | 5 | 6 | ... | 10 | 11 | 12 | 13 | 14 | 15 |
|---|---|---|---|---|---|---|---|---|---|---|---|---|---|---|
| A1 | 1 | 1 | 1 | 1 | 0 | 0 | 0 | | 0 | 0 | 0 | 0 | 0 | 1 |
| A2 | 1 | 1 | 1 | 0 | 0 | 0 | 0 | | 0 | 0 | 0 | 0 | 1 | 1 |
| A3 | 1 | 1 | 0 | 0 | 0 | 0 | 0 | | 0 | 0 | 0 | 1 | 1 | 1 |
| NCLR | 1 | 1 | 1 | 1 | 1 | x | x | | x | 1 | 1 | 1 | 1 | 1 |
| NCLK | x | 1 | 1 | 1 | 1 | x | x | | x | 1 | 1 | 1 | 1 | 1 |
| RAM1 | x | x | x | D1 | D1 | D1 | D1 | | D1 | D1 | D1 | D1 | D1 | x |
| MS1 | x | x | D2 | D2 | D2 | D2 | x | | D2' | D2' | D2' | D2' | D1 | x |
| RAM2 | x | D3 | D3 | D3 | D3 | D3 | D3 | | D3 | D3 | D3 | D2' | D1 | x |
| VERIFY NODE | x | x | D3 | D3 | D3 | D3 | D3 | | D3 | D3 | D3 | D2' | D1 | x |

FIG.15

| USER CLOCK | POSITIVE EDGE TRIGGERED ||| NEGATIVE EDGE TRIGGERED |||
|---|---|---|---|---|---|---|
| | NCLK @ REG | DATA LOSS ENTERING USER MODE? | DATA LOSS ENTERING VERIFY MODE? | NCLK @ REG | DATA LOSS ENTERING USER MODE? | DATA LOSS ENTERING VERIFY MODE? |
| HIGH | LOW | H→L YES | L→H NO | HIGH | H→H NO | H→H NO |
| LOW | HIGH | H→H NO | H→H NO | LOW | H→L YES | L→H NO |

FIG.16

| T | 0 | 1 | 2 | 3 | 4 | 5 | 6 | ... | 10 | 11 | 12 | 13 | 14 | 15 |
|---|---|---|---|---|---|---|---|---|---|---|---|---|---|---|
| A1 | — | — | — | — | 0 | 0 | 0 | ... | 0 | 0 | 0 | 0 | 0 | — |
| A2 | — | — | — | 0 | 0 | 0 | 0 | ... | 0 | 0 | 0 | 0 | — | — |
| A3 | — | — | 0 | 0 | 0 | 0 | 0 | ... | 0 | 0 | 0 | — | — | — |
| NCLR | — | — | — | — | — | x | x | ... | x | — | — | — | — | — |
| NCLK | 0 | 0 | 0 | 0 | 0 | x | x | ... | x | — | — | — | 0 | 0 |
| USERCLK | x | x | x | x | x | x | x | ... | x | x | x | x | x | x |
| NFRZCOMB | 0 | 0 | 0 | 0 | 0 | — | — | ... | — | — | 0 | 0 | 0 | 0 |
| GLOBFRZREG | 0 | 0 | 0 | 0 | 0 | 0 | 0 | ... | 0 | — | — | — | — | — |
| RAM1 | x | x | x | D1 | D1 | D1 | D1 | ... | D1 | D1 | D1 | D1 | D1 | x |
| NS1 | x | x | D2 | D2 | D2 | D2 | x | ... | D2' | D2' | D2' | D2' | D1 | x |
| RAM2 | x | x | D3 | D3 | D3 | D3 | D3 | ... | D3 | D3 | D3 | D2' | D1 | x |
| VERIFY NODE | x | x | D3 | D3 | D3 | D3 | D3 | ... | D3 | D3 | D3 | D2' | D1 | x |

FIG. 18

PROGRAMMABLE LOGIC DEVICE WITH CIRCUITRY FOR OBSERVING PROGRAMMABLE LOGIC CIRCUIT SIGNALS AND FOR PRELOADING PROGRAMMABLE LOGIC CIRCUITS

This application is a division of U.S. patent application Ser. No. 09/608,061, filed Jun. 29, 2000 now U.S. Pat. No. 6,481,000, which is a continuation of U.S. patent application Ser. No. 09/082,867, filed May 21, 1998, now U.S. Pat. No. 6,157,210, which claims the benefit of U.S. provisional application No. 60/062,079, filed Oct. 16, 1997.

BACKGROUND OF THE INVENTION

This invention relates to programmable logic devices. More particularly, this invention relates to observing logic signals at the outputs of various programmable logic circuits on programmable logic devices and preloading data into such programmable logic circuits.

Programmable logic devices are integrated circuits that may be programmed by a user to perform various logic functions. As programmable logic devices become more complex, it is becoming desirable to observe the logic signals on internal device nodes in order to determine whether a device is functioning properly. The ability to observe such logic signals (e.g., at the outputs of logic elements or other programmable logic circuits) reduces test costs by reducing test development time and test run time during manufacturing. The ability to observe these logic signals also helps to reduce the time needed to successfully debug a given design for a programmable logic device. Being able to preload data into certain programmable logic circuits also reduces test costs and helps to reduce the time needed to debug a design.

It is therefore an object of the present invention to provide arrangements for observing logic signals from various programmable logic circuits on a programmable logic device.

It is another object of the present invention to provide arrangements for preloading data into certain programmable logic circuits on a programmable logic device.

SUMMARY OF THE INVENTION

These and other objects of the invention are accomplished in accordance with the principles of the present invention by providing programmable logic devices that contain circuitry for observing logic signals from programmable logic circuits during device testing. The programmable logic devices may also contain circuitry for preloading test signals into the programmable logic circuits.

The programmable logic circuits each contain programmable logic that may be configured using configuration signals applied from memory cells or other suitable control elements in which programming data has been stored. If desired, the programmable logic circuits may be programmable logic elements that contain combinatorial logic such as look-up table logic and that contain register logic. Programmable logic elements are typically arranged in at least one column or row, and on some programmable logic devices are arranged in arrays containing both columns and rows.

Programmable logic elements may be organized in groups of logic called logic array blocks. Each logic array block may be part of a larger logic region called a group of logic array blocks. Interconnection conductors of various lengths may be used to interconnect the logic in regions of different sizes.

One aspect of the invention involves using an array of addressable access transistors to observe logic signals. In an array of programmable logic elements, each programmable logic element may be provided with an associated access transistor at its combinatorial or registered output. Decoder logic may be used to turn on a given row of the access transistors. Turning on the access transistors allows signals from the logic elements to be passed to a test register.

If desired, additional logic may be used to select a given column of logic elements from which it is desired to observe logic signals. A snapshot may be taken of the logic element signals at a given point in time by freezing the clock applied to the logic elements. Sense lines may be used to route logic signals from the access transistors to the test register. Each logic element may be connected to a pair of sense lines by a pair of respective access transistors (e.g., one access transistor used to observe combinatorial signals and one access transistor used to observe registered signals).

Another aspect of the invention involves the use of registers on a programmable logic device that may be connected in a scan chain by switching circuits (i.e., multiplexers) when it is desired to observe logic element signals. The switching circuits have logic element inputs that receive signals from logic elements. The switching circuits also have scan chain inputs. The outputs of the switching circuits are connected to the registers. During normal operation, the switching circuits are configured to connect their logic element inputs to their outputs so that the logic signals from the logic elements are stored in the registers. During register observation, the switching circuits are configured to connect their scan chain inputs to their outputs so that the logic signals stored in the registers may be scanned out of the registers through the scan chain. The registers can also be initialized using the scan chain. Clock and clear control logic may be used to prevent data corruption during transitions between modes (i.e., during the transition between register initialization and normal operation and during the transition between normal operation and register observation).

Similar switching circuits may also be provided to observe memory block signals that are stored in the input and output registers of a programmable logic device memory block and to initialize those registers if desired. The programmable logic device may have rows and columns of groups of logic array blocks. Each group of logic array blocks may contain a plurality of logic array blocks, each of which contains a plurality of memory elements, and a memory block. The switching circuits associated with the logic elements and the memory block switching circuits may be connected to form a number of scan chains, each of which is associated with a separate row of the groups of logic array blocks. This allows the registers in each row to be initialized in parallel and for logic signals in each row to be observed in parallel.

Another aspect of the invention involves programmable logic device arrangements in which logic signals may be observed by making logic element registers part of first-in-first-out (FIFO) programming chains that are used on the device to program certain programmable logic circuits. The logic element registers may be incorporated into the FIFO chains by connecting the output of a memory cell in the chain to either the master latch input or slave latch input of the register.

The memory cells in the chain may be programmed with programming data to configure programmable logic within the programmable logic circuits to which the memory cells are connected. During normal operation of the programmable logic device, the logic element registers that are connected in the FIFO chain are used to register signals in the logic elements.

The programmable logic device may be operated in a programming mode (when programming data is placed in the memory cells), a user mode (when the device is operating normally) and a verify mode (when the device is being tested). The logic element registers each have a clock input. The programmable logic device is provided with clock control logic for controlling the clock signals applied to the clock input to ensure that there is no possibility of data corruption when entering the user mode from the programming mode or when leaving the user mode to enter the verify mode.

Another aspect of the invention involves arrangements for observing register signals on a programmable logic device using a chain of shadow memory cells. The shadow memory cells may be made part of a first-in-first-out chain of regular memory cells that are used to apply programming data to configure logic in various programmable logic circuits on the programmable logic device. The shadow memory cells are not directly connected to any programmable logic circuits for configuring the logic in those circuits. Shadow memory cells may be interspersed between respective regular memory cells in the first-in-first-out programming chain. If desired, the shadow memory cells may be arranged in a chain that contains only shadow memory cells. After the logic element register data that is to be observed has been loaded into the shadow memory cells in the chain, the data may be unloaded from the chain into a test register.

The outputs of the shadow memory cells may be applied to feedback terminals for the logic element registers using preload transistors. Preload data may be shifted into the shadow memory cells using the first-in-first-out chain. The registers may then be preloaded by turning on the preload transistors so that the preload data from the shadow memory cells passes to the logic element registers.

Another aspect of the invention relates to observing logic signals from programmable logic circuits on a programmable logic device in which programming data for the programmable logic circuits is stored in an array of memory cells. The programming data may be provided to the array using data lines. Each data line may be associated with a separate row of the memory cells. Memory cells may be addressed using address lines, each of which may be associated with a column of the memory cells.

The programmable logic circuits may be programmable logic elements that are organized in logic array blocks and groups of logic array blocks. Data from the programmable logic circuits may be provided to interconnect drivers such as local line drivers, global horizontal line drivers, vertical line drivers, and horizontal line drivers. A number of pass transistors may be provided for selectively connecting the interconnect drivers to debug output lines. The data to be observed from the programmable logic circuits is provided to a test register by the debug output lines.

Another aspect of the invention relates to observing programmable logic circuit logic signals on a programmable logic device using sense lines each of which is associated with a different column of programmable logic circuits. The programmable logic device has memory cells that may be programmed with programming data to configure programmable logic within the programmable logic circuits. Data lines may be used to provide the programming data to the memory cells. Address lines may be used to address particular memory cells when the programming data is being stored in the memory cells.

Access transistors are associated with each programmable logic circuit for selectively conveying the logic signals from that programmable logic element to the associated sense line. Routing circuitry is provided that routes the signals that are to be observed from the access transistors to a test register. The routing circuitry may contain a number of multiplexers each of which has one input connected to one of the data lines and another input connected to one of the sense lines. The outputs of the multiplexers are connected to the test register. The multiplexers may be configured to connect their sense line inputs to their outputs when it is desired to pass the logic signals that are to be observed from the access transistors to the test register. The multiplexers may also be configured to connect their data line inputs to their outputs when it is desired to connect the data lines to the test register.

The programmable logic device contains preload circuitry for preloading data into the programmable logic circuits. A preload transistor that is controlled by one of the data lines may be associated with each of the programmable logic circuits. Preload data may be provided to the test register. Preload drivers and routing circuitry may be used to provide the preload data to the preload transistors. When the data line that controls a given preload transistor is activated, the preload transistor is turned on and the preload data provided to the preload transistors is preloaded into the associated programmable logic circuit.

Logic signals may be observed from all of the programmable logic circuits in a row simultaneously by turning on all of the access transistors in a row that are controlled by a given data line in that row. Similarly, preload data may be provided to all of the programmable logic circuits in a row simultaneously by turning on all of the preload transistors that are controlled by a given data line in that row.

Another aspect of the invention relates to observing programmable logic circuit logic signals on a programmable logic device using an arrangement in which a debug address register is provided as part of an address register chain. The output of the debug address register controls access transistors that are connected to the outputs of various programmable logic circuits. When a suitable debug address bit is shifted into the debug address register, the access transistors connected to that debug address register are turned on. This causes the logic signals from the programmable logic circuits connected to the turned on access transistors to be provided to associated data lines. The data lines convey the logic signals to a test register for observation and analysis.

Data may be preloaded into the programmable logic circuits using preload transistors connected between data lines associated with the programmable logic circuits and inputs to the programmable logic circuits. Preload transistors may be controlled by signals from a preload address register provided in a chain of address registers. The chain of address registers in which the preload address register is provided and the chain of address registers in which the debug address register is provided may be either the same chain or different chains.

Memory cells on the programmable logic device receive programming data via the data lines. The outputs of the memory cells are applied to the programmable logic circuits to configure programmable logic in the programmable logic circuits. The regular address registers in each address register chain are used to store address signals that are applied to the memory cells via address lines. The address signals selectively direct the programming data that is provided on the data lines into desired memory cells during device programming.

Further features of the invention and its nature and various advantages will be more apparent from the accompanying drawings and the following detailed description of the preferred embodiments.

BRIEF DESCRIPTION OF THE DRAWINGS

FIG. 7a is a diagram of illustrative circuitry for observing logic element signals using switching circuits to selectively connect logic element registers into a chain from which the logic element signals may be shifted in accordance with the present invention.

FIG. 7b is a diagram of more illustrative circuitry for observing logic element signals using switching circuits to selectively connect logic element registers into a chain from which the logic element signals may be shifted in accordance with the present invention.

FIG. 7d is a diagram illustrating how input/output registers, logic element registers, and memory block registers can be connected to form a chain in accordance with the present invention.

FIG. 7e is a diagram illustrating how the logic array blocks (LABs) and embedded array blocks (EABs) in the groups of logic array blocks (GOLs) in a row may be interconnected to form a chain in accordance with the present invention.

FIG. 11 is a diagram of illustrative register circuitry that may be used in a first-in-first-out programming chain in accordance with the present invention.

FIG. 12 is a timing diagram illustrating the operation of the circuitry of FIG. 11 in accordance with the present invention.

FIG. 13 is a table of attributes associated with using positive edge triggered register circuitry and negative edge triggered register circuitry in a first-in-first-out programming chain using the FIG. 11 register circuitry arrangement in accordance with the present invention.

FIG. 15 is a timing diagram illustrating the operation of the circuitry of FIG. 14 in accordance with the present invention.

FIG. 16 is a table of attributes associated with using positive edge triggered register circuitry and negative edge triggered register circuitry in a first-in-first-out programming chain using the FIG. 14 register circuitry arrangement in accordance with the present invention.

FIG. 18 is a timing diagram illustrating the operation of the circuitry of FIG. 17 in accordance with the present invention.

DETAILED DESCRIPTION OF THE PREFERRED EMBODIMENTS

The present invention relates to schemes for observing logic signals from programmable logic circuits on programmable logic devices and for preloading data into various programmable logic circuits. The ability to observe logic signals and the ability to preload data is useful when debugging a programmable logic device during development.

One aspect of the invention involves using a Joint Test Action Group (JTAG) test access port to access internal nodes. The JTAG test access port is a standard type of test access port specified in "IEEE Standard Test Access Port and Boundary-Scan Architecture", IEEE Std 1149.1-1990 (includes IEEE Std 1149.1a-1993), published by the Institute of Electrical and Electronics Engineers, Inc. on Oct. 21, 1993. JTAG ports use a relatively small number of pins such as TMS (test mode select), TCK (test clock), TDI (test data in), and TDO (test data out) to perform various boundary scan tests. Conventional boundary scan testing involves observing a small subset of the observable nodes in a device using special boundary scan cells arranged in a chain throughout the device.

In accordance with the present invention, JTAG test access ports may be used to supply test data to various portions of programmable logic circuitry on the device and to route signals from probed internal nodes off of the device. The JTAG test access port may be used when observing internal nodes on any suitable type of programmable logic device. The testing schemes of the present invention are primarily described in connection with the use of programmable logic devices of the type shown in FIG. 1 to simplify the presentation of this material. The internal nodes of any other suitable type of programmable logic device or logic integrated circuit may be observed in a similar fashion if desired.

Figure 1:
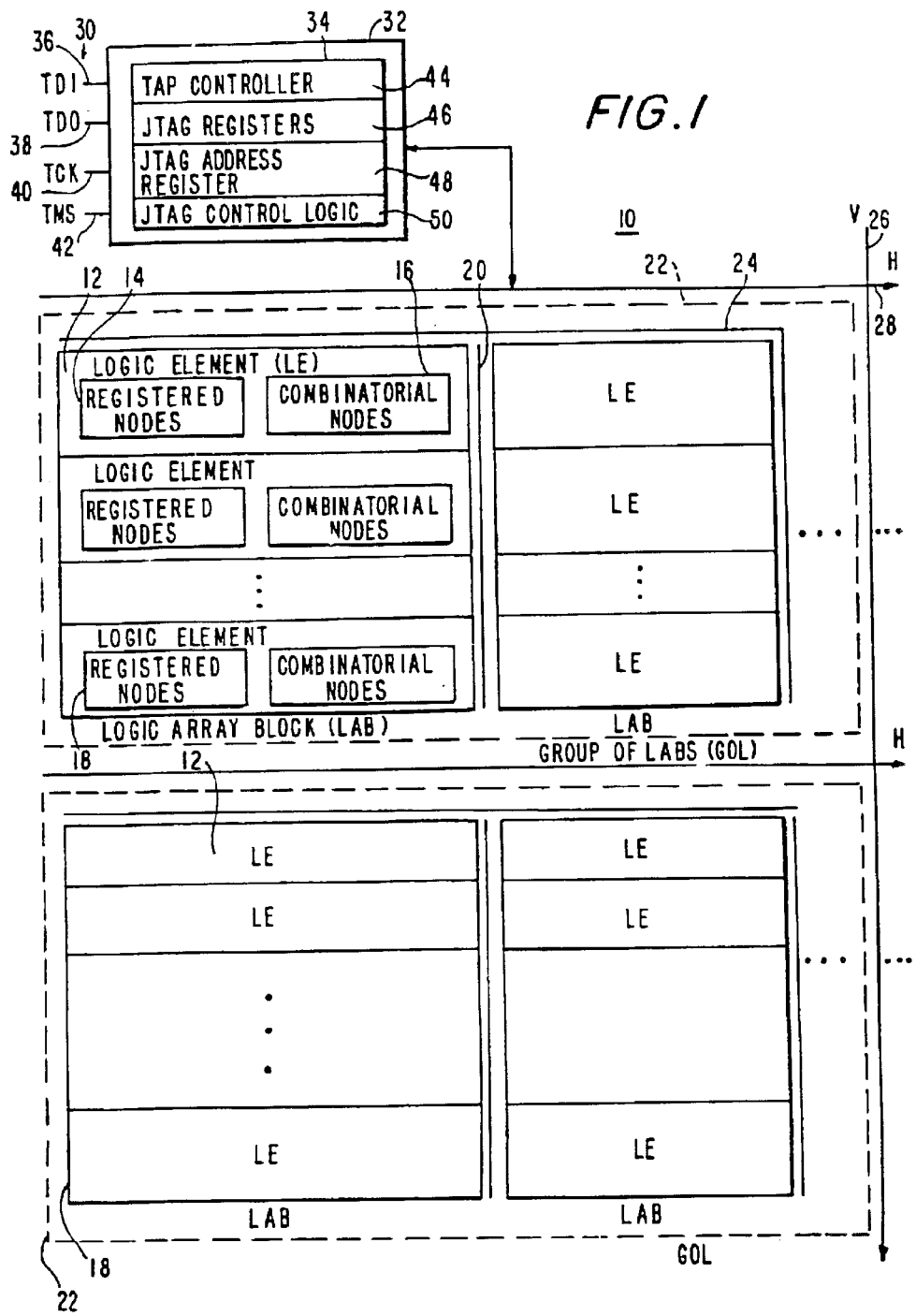
FIG. 1 is a diagram of an illustrative programmable logic device having programmable logic elements arranged in logic array blocks and groups of logic array blocks in accordance with the present invention.

Programmable logic device 10 of FIG. 1 has a number of programmable logic elements (LEs) 12, each of which contains one or more registered nodes 14 and one or more combinatorial nodes 16 from which logic signals are to be observed. Logic elements 12 (sometimes referred to as macrocells) may be any suitable type of programmable logic device logic elements, such as logic elements based on look-up table logic, product term logic, or any other suitable type of logic. A typical combinatorial node 16 may be the output of a look-up table. The look-up table may feed a register whose output may be one of the registered nodes 14.

Logic elements 12 may be arranged in groups of elements called logic array blocks (LABs). The logic elements 12 in each logic array block 18 may be interconnected by local lines 20. Multiple logic array blocks 18 may be arranged as a group of LABs (GOL). Within each GOL 22, signals may be routed between LABs 18 via global horizontal (GH) lines 24. Signals may be vertically routed between GOLs 22 in a column by vertical (V) lines 26. Signals may be horizontally routed between GOLs 22 in a row by horizontal (H) lines 28. Other suitable programmable logic device arrangements may use different types of conductors, such as global vertical (GV) conductors to vertically connect LABs 18 that are arranged in columns within a GOL 22. Interconnection conductors such as local lines 20, GH lines 24, horizontal lines 28, and vertical lines 26 may include fractional length conductors (e.g., half-length, quarter-length, eighth-length conductors, etc.).

Programmable logic device 10 may have a JTAG test access port made up of a multiple-pin interface 30 connected to test circuitry 32 containing JTAG block 34. Interface 30 may contain a test data in pin 36, a test data out pin 38, a test clock pin 40, and a test mode select pin 42. Test data in pin 36 is used to apply test signals to device 10. Test data out pin 38 is used to read out logic signals from device 10. Test clock pin 40 is used to supply a test clock to test registers on device 10. Test mode select pin 42 is used to control the mode of device 10 (e.g., to isolate logic to be tested from surrounding circuitry). JTAG block 34 contains hardware and software based components 44, 46, 48, and 50 for providing JTAG functions.

Figure 2:
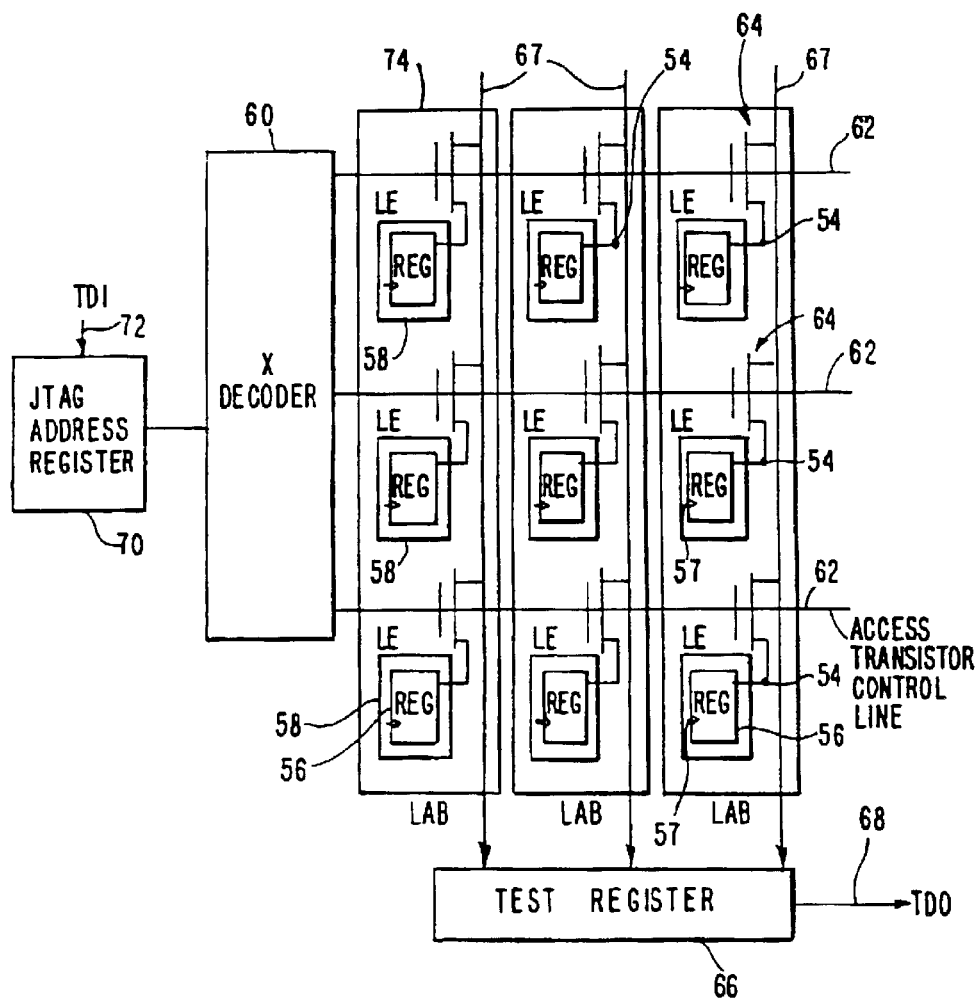
FIG. 2 is a diagram of illustrative circuitry for observing logic element signals with an array of access transistors and associated sense lines in accordance with the present invention.

An approach for monitoring internal device nodes that allows a snapshot of the logic signals on the monitored nodes to be taken is shown in FIG. 2. In the illustrative programmable logic device 52 of FIG. 2, logic element outputs 54 are shown as being registered nodes (i.e., outputs 54 are located at the output of logic element registers 56, which are part of logic elements such as logic element 58). However, outputs 54 may be combinatorial nodes if desired. Multiple logic elements (e.g., eight logic elements) such as logic elements 58 may be part of a logic array block such as logic array block 74.

When a snapshot of the logic signals at outputs 54 is to be taken, the clock signal applied to clock inputs 57 of registers 56 is frozen. X decoder 60 then takes a selected one of access transistor control lines 62 high, thereby turning on the access transistors 64 in that row. This causes the logic signals on the outputs 54 in the row to be provided to test register 66 via sense lines 67. The captured signals may then be scanned out of test register 66 via test data out pin 68. If desired, test register 66 may be the test register normally used for unloading programming data supplied to first-in-first-out (FIFO) programming chains of memory cells on the programmable logic device during testing of these FIFO chains (e.g., under conditions of different temperature, power supply voltage, etc.).

Signals supplied to x decoder 60 using JTAG address register 70 and test data in pin 72 may be used to determine which of the access transistor control lines 62 are taken high by x decoder 60. The use of JTAG address register 70 to store these signals reduces the number of test pins required to supply such signals to access transistor control lines 62. If desired, the clock signal applied to clock inputs 57 may be frozen, the signals examined, and the clock signal subsequently restarted. In the arrangement of FIG. 2 and in the other arrangements described herein, the use of the JTAG test access port may be desirable, but is not required. Any suitable test interface may be used.

Figure 3:
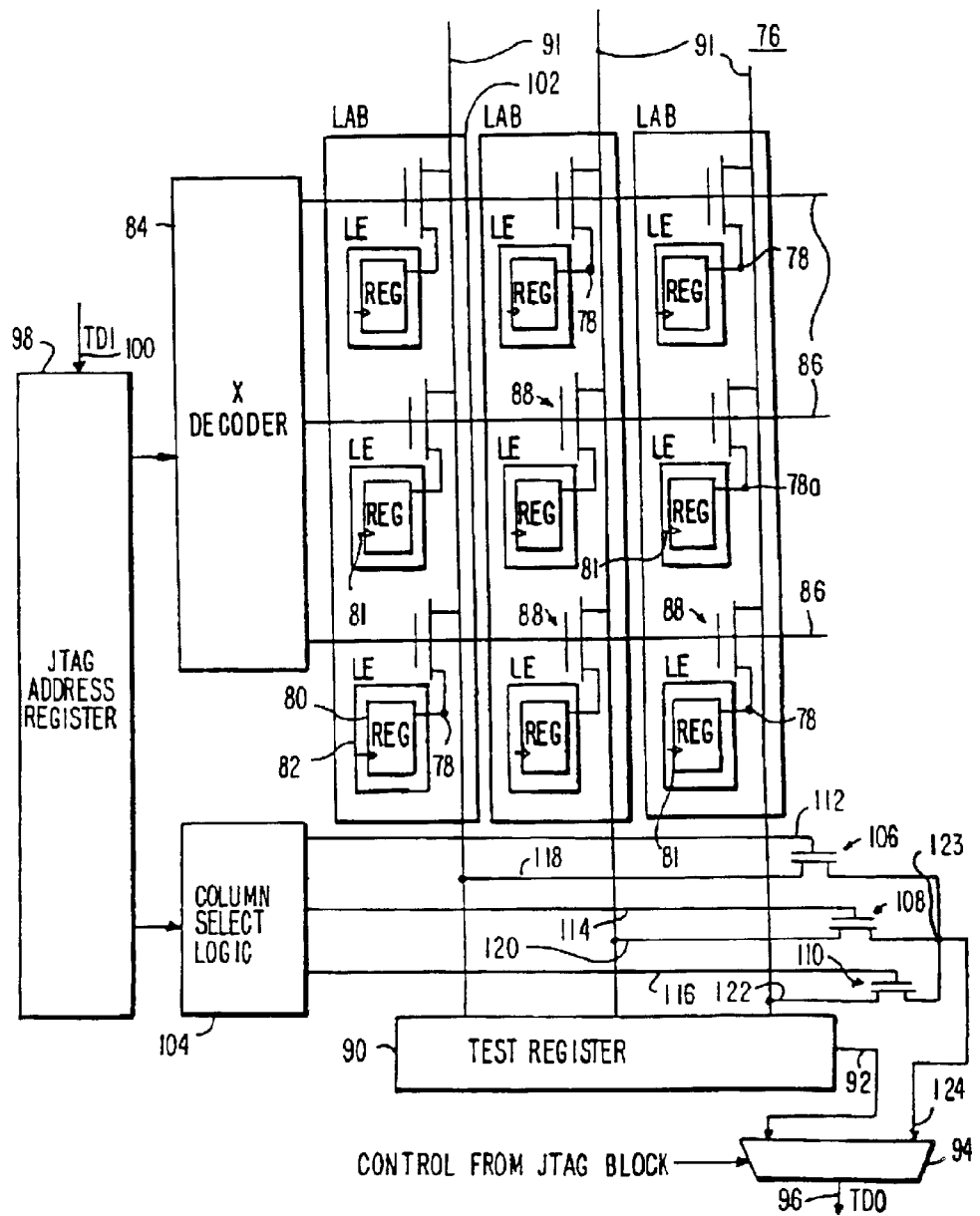
FIG. 3 is a diagram of illustrative circuitry for observing logic element logic signals with an array of column-addressable access transistors and associated sense lines in accordance with the present invention.

Another approach for observing logic signals from logic elements on a programmable logic device that allows a snapshot of the signals to be taken is shown in FIG. 3. In programmable logic device 76 of FIG. 3, outputs 78 are shown as being registered nodes (i.e., nodes that are located at the output of logic element registers 80, which are part of logic elements such as logic elements 82). If desired, outputs 78 may be combinatorial nodes. Multiple logic elements (e.g., eight logic elements) such as logic elements 82 may be part of a logic array block such as logic array block 102.

When a snapshot of the state of outputs 78 is to be taken, the clock signal applied to clock inputs 81 of registers 80 is frozen. X decoder 84 then takes a selected one of access transistor control lines 86 high, thereby turning on the access transistors 88 in that row. This causes the logic signals on the outputs 78 in the row to be provided to test register 90 via sense lines 91. The signals are captured by test register 90. The signals may then be scanned out of test register 90 via line 92, multiplexer 94, and test data out pin 96. If desired, test register 90 may be the test register normally used for unloading programming data supplied to first-in-first-out (FIFO) programming chains of memory cells on the programmable logic device. The state of multiplexer 94 is controlled by control signals provided from a JTAG block such as JTAG block 34 of FIG. 1, so that the signals on line 92 are connected to test data out pin 96.

Signals supplied to x decoder 84 using JTAG address register 98 and test data in pin 100 may be used to determine which of the access transistor control lines 86 are taken high by x decoder 84. The use of JTAG address register 98 to store these signals reduces the number of test pins required to supply such signals to access transistor control lines 86. If desired, the clock signal applied to clock inputs 81 may be frozen, the signals examined, and the clock signal subsequently restarted.

In addition to snapshot measurements of the signals on outputs 78, the arrangement of device 76 allows the signals on outputs 78 to be continuously monitored in real time. The user may select a given output to observe by using x decoder 84 to turn on a given row of access transistors 88 and by simultaneously using column select logic 104 to turn on a selected one of column select transistors 106, 108, and 110 using the appropriate column select line 112, 114, or 116. For example, to observe logic signals at output 78a, x decoder 84 takes the access transistor control line 86 that is in the second row of logic elements 80 and access transistors 88 high, thereby turning on all of the access transistors 88 in that row. This connects the nodes 78 in that row to lines 118, 120, and 122, respectively, via sense lines 91. While x decoder 84 turns on the appropriate row of access transistors 88, column select logic 104, which is controlled by signals received from JTAG address register 98, turns on access transistor 110 by taking column select line 116 high, so that the signal on the sense line 91 that is associated with output 78a is routed to common output 123 and input 124 of multiplexer 94. The state of multiplexer 94 is controlled by control signals provided from a JTAG block such as JTAG block 34 of FIG. 1, so that the signals on input 124 are connected to test data out pin 96. The user can continuously monitor the signals on test data out pin 96 (which are real-time logic signals from output 78a) to aid in debugging device 76.

The arrangements of FIGS. 2 and 3 provide wide-scale observability of the logic signals on the programmable logic device, because the outputs of all or nearly all of the logic elements on the device may be monitored if desired. In contrast, standard JTAG boundary scan schemes only allow users to observe signals at a relatively small number of scan cells, which are located around the periphery of a region of logic. The arrangements of FIGS. 2 and 3 also allow logic elements to be addressed by row. Both arrangements allow snapshot monitoring. The arrangement of FIG. 3 also allows nodes to be continuously monitored in real time. Because the JTAG test access port is used in both arrangements, testing is possible using standard programmable logic device test equipment.

Figure 4:
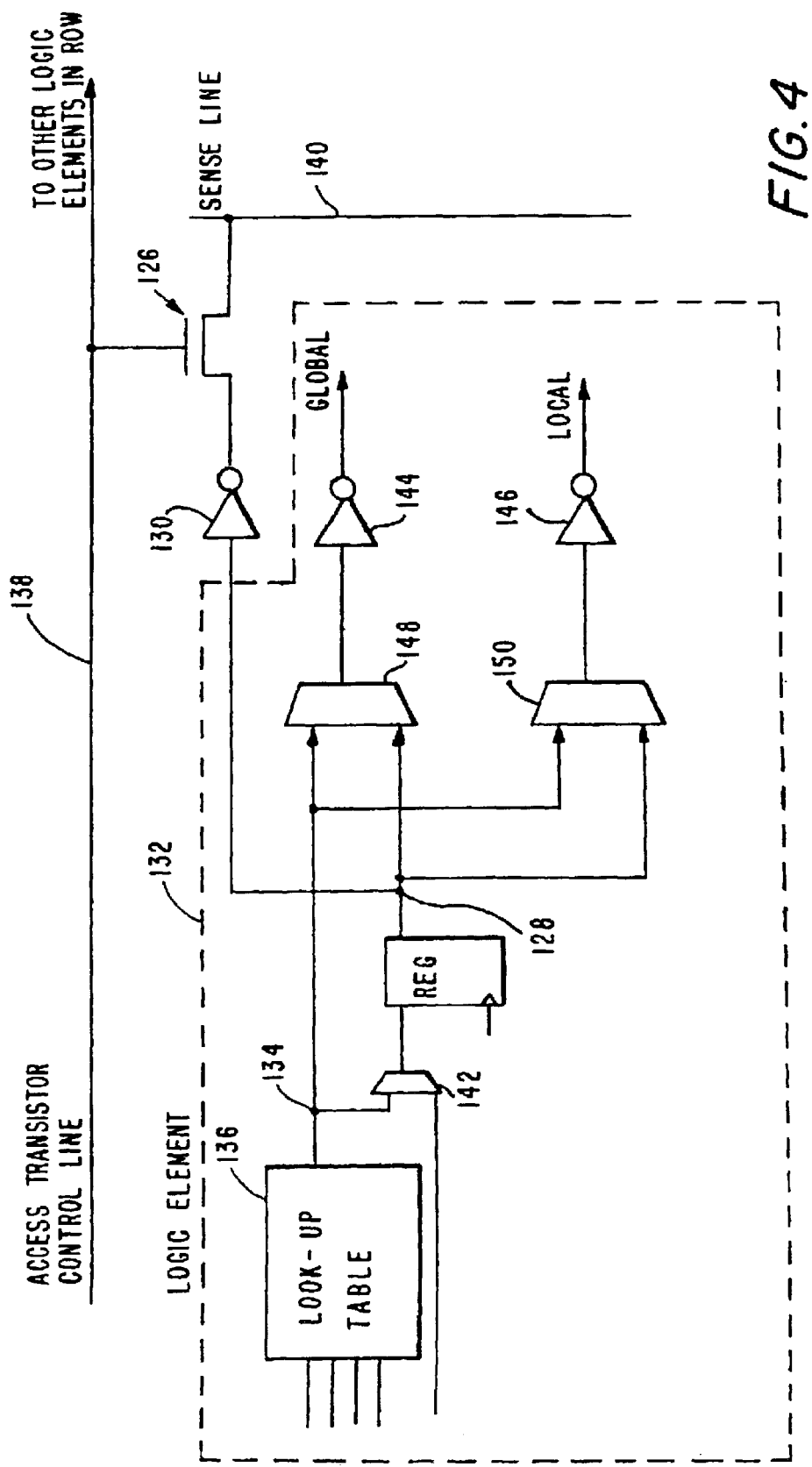
FIG. 4 is a diagram of an illustrative logic element from which registered logic signals may be observed using a sense line in accordance with the present invention.

Various approaches may be used for connecting access transistors such as access transistors 64 of FIG. 2 and access transistors 88 of FIG. 3 to the programmable logic device nodes of interest. One such approach is shown in FIG. 4. In the FIG. 4 arrangement, access transistor 126 is connected to registered node 128 via driver 130. Logic element 132 has a combinatorial node 134 at the output of look-up table 136, but the FIG. 4 arrangement does not allow the signal at that node to be monitored directly. To monitor the logic element output signal at node 128, the user takes access transistor control line 138 high to turn on access transistor 126 and thereby connect node 128 to sense line 140. Sense line 140 and access transistor control line 138 may be connected to circuitry such as the circuitry shown in FIGS. 2 and 3.

Other circuitry shown in the illustrative logic element 132 of FIG. 4 includes bypass multiplexer 142, and output drivers 144 and 146. Multiplexers 148 and 150 are used to select the desired output signals for output drivers 144 and 146. Output driver 144 may drive logic element output signals onto global lines such as global horizontal line 24 of FIG. 1. Output driver 146 may drive logic element output signals onto local lines such as local lines 20 of FIG. 1. Other drivers (not shown in FIG. 4) may be used to drive logic element output signals onto vertical and horizontal lines such as V lines 26 and H lines 28 of FIG. 1.

Figure 5:
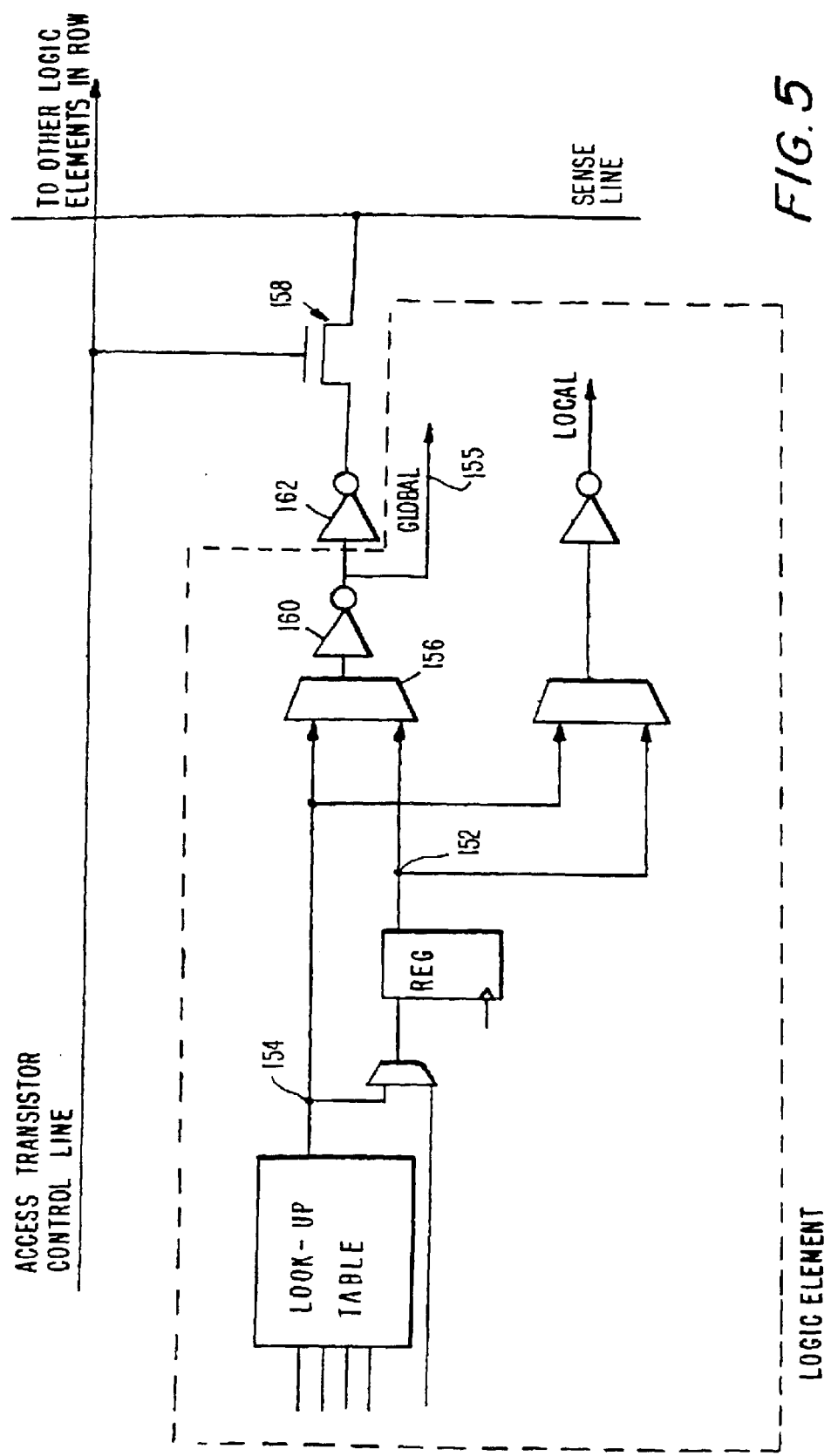
FIG. 5 is a diagram of an illustrative logic element from which combinatorial or registered logic signals may be observed using a sense line in accordance with the present invention.

Another arrangement for connecting the access transistor to the node of interest is shown in FIG. 5. The FIG. 5 arrangement allows logic element output signals at both registered node 152 and combinatorial node 154 to be observed. When multiplexer 156 is configured to connect combinatorial node 154 to global lines 155, signals at node 154 may be provided to access transistor 158 via drivers 160 and 162. When multiplexer 156 is configured to connect registered node 152 to global lines 155, signals at node 152 may be provided to access transistor 158 via drivers 160 and 162.

Figure 6:
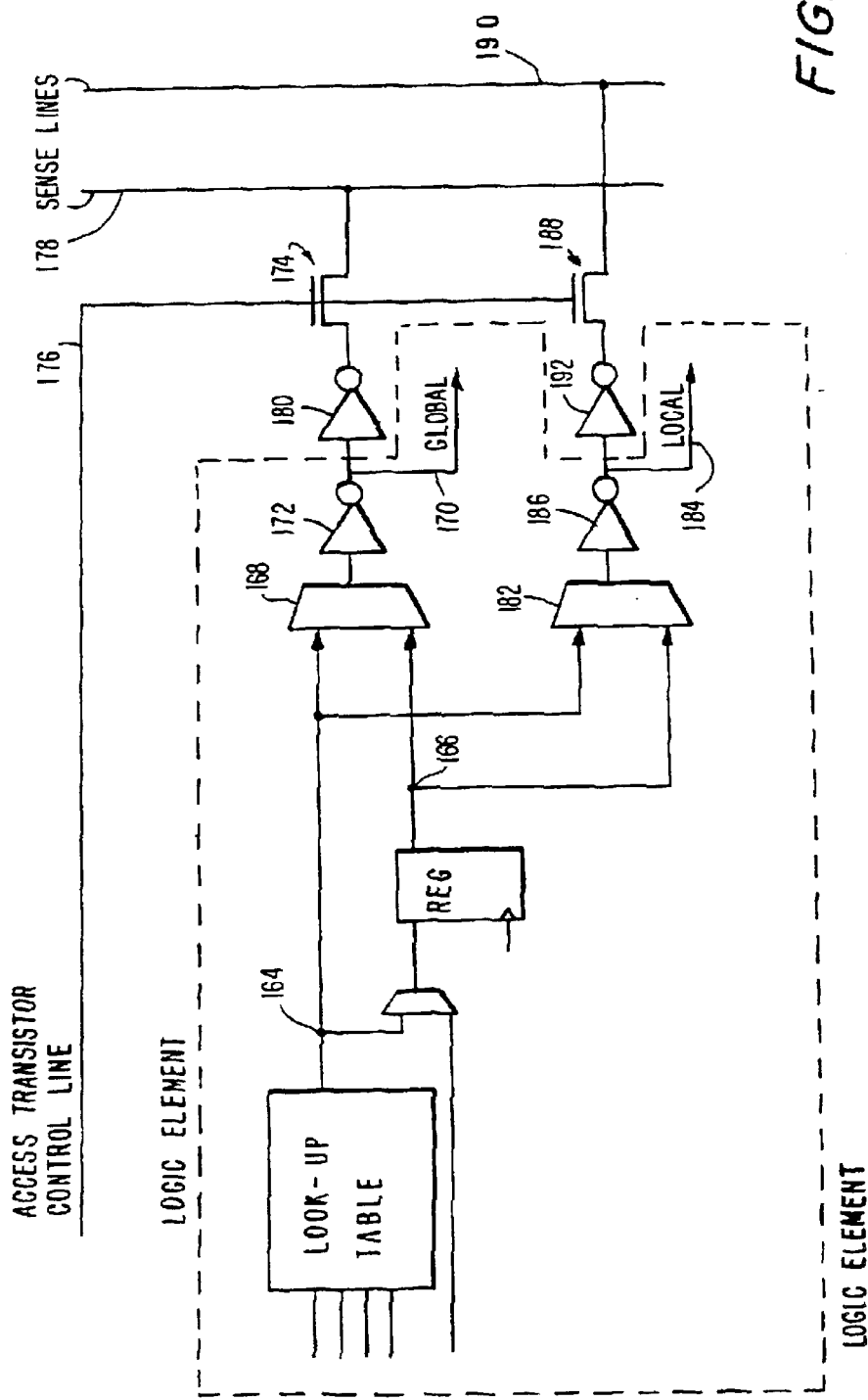
FIG. 6 is a diagram of an illustrative logic element from which both registered and combinatorial logic signals may be observed simultaneously using two sense lines in accordance with the present invention.

With the arrangement shown in FIG. 6, logic element signals at combinatorial node 164 and registered node 166 can both be observed simultaneously. For example, when multiplexer 168 is configured to connect combinatorial node 164 to global lines 170 via driver 172, the signal on combinatorial node 164 may be observed by turning on access transistor 174 with access transistor control line 176. This causes the signal on node 164 to be applied to sense line 178 via multiplexer 168, driver 172, driver 180, and access transistor 174. If, at the same time, multiplexer 182 is configured to connect registered node 166 to local lines 184 via driver 186, the signal on registered node 166 may be observed simultaneously by turning on access transistor 188 with access transistor control line 176. This causes the signal on node 166 to be applied to sense line 190 via multiplexer 182, driver 186, driver 192, and access transistor 188.

Similarly, signals from node 164 can be observed at sense line 190 while signals from node 166 are simultaneously observed at sense line 178, provided that multiplexers 168 and 182 are configured appropriately. However, if multiplexers 168 and 182 are configured so that logic element output signals from the same node (i.e., either combinatorial node 164 or registered node 166) are applied to both global lines 170 and local lines 184 at the same time, then only signals from that single node may be observed.

Another programmable logic device arrangement for observing programmable logic element output signals is shown in FIG. 7a. In the arrangement of FIG. 7a, logic element registers 194 are connected in a scan chain using switching circuits (multiplexers) 196. Registers 194 are the registers used for providing registered logic element output signals (i.e., registers 194 generally operate like the logic element registers shown in FIGS. 4–6). Each switching circuit 196 has at least one logic element input 198 and a scan chain input 200. Logic elements 201 may be arranged in logic array blocks 203 each of which may contain, e.g., eight logic elements 201.

During normal programmable logic device operation, the logic element input 198 of each switching circuit 196 receives logic signals from logic element logic 202 (e.g., logic of the general type shown in the logic element arrangements of FIGS. 4–6). Each switching circuit 196 directs the signal from its input 198 to its output 204. The signals on switching circuit outputs 204 are registered by logic element registers 194 and provided to logic element outputs 206. The signals on logic element outputs 206 are routed by driver circuitry to local lines, global horizontal (GH) lines, V lines, and H lines. A normal clock signal is applied to clock inputs 208 of registers 194 during normal operation.

During register observation, a suitable instruction is provided (e.g., with a JTAG TAP controller such as JTAG TAP controller 44 of FIG. 1) that freezes the state of the device by stopping the normal clock and reconfiguring switching circuits 196 to form a continuous scan chain by connecting scan chain inputs 200 to outputs 204. Scan chain conductors 210 connect the outputs of each register 194 to the scan chain input 200 of a successive switching circuit 196 in the chain. A scan clock is applied to clock inputs 208 of registers 194 to scan the contents of registers 194 out of the scan chain using test data output 212.

If desired, registers 194 may be initialized by loading registers 194 with data provided at test data input 214 when registers 194 are in the scan chain configuration. During initialization, an initialization clock is applied to clock inputs 208. After the registers have been loaded with initialization data, the device can be operated normally.

Both test data input 214 and test data output 212 are preferably coupled to pins that are part of a JTAG test access port such as the JTAG test access port shown in FIG. 1.

Because the arrangement of FIG. 7a requires only a relatively small amount of additional circuitry to provide test coverage, the FIG. 7a arrangement is a cost-effective way in which to provide wide-scale observability of the logic signals on a programmable logic device. If desired, an arrangement similar to the arrangement shown in FIG. 7a may be implemented by using programmable logic resources to form the scan chain conductor connections.

As shown in FIG. 7b, the switching circuits may have more than one logic element input. Switching circuit 196' in logic element 18' has logic element input 198a, which is a combinatorial output of look-up table logic 199, and logic element input 198b, which is a signal line that bypasses look-up table logic 199. To form a scan chain, gate 203a is turned on using control line 205a while gates 203b and 203c are turned off using control lines 205b and 205c. This connects scan in line 201a to the scan out line of a preceding logic element in the chain. Scan out line 201b is connected to the scan in line of the next logic element in the chain. Accordingly, when gate 203a is turned on, initialization data may be scanned into registers 207 using an initialization clock provided at initialization clock line 209a.

During normal operations, either gate 203b or gate 203c is turned on while gate 203a is turned off. This allows logic signals from logic element logic 202 to be provided to register 207 via switching circuit output 204', while a normal clock is provided at normal clock line 209b.

To observe logic signals in registers 207 after a period of normal operation, gate 203a is turned on while gates 203b and 203c are turned off. This forms a scan chain of registers 207 that allows logic signals to be scanned out of the registers 207 using a scan clock provided at scan clock line 209c.

Care must be taken during the transition from initialization mode to normal mode and during the transition from normal mode to scan out mode to avoid corrupting the register data. For example, during the transition from initialization mode to normal mode, the initialization clock applied to registers 207 must be replaced by the normal clock while ensuring that sufficient time is allowed for logic element signals on inputs 198a and 198b to settle and for the gates in switching circuit 196' to switch completely. During transitions from normal mode to register observation mode, the normal clock applied to registers 207 must be replaced by the scan clock. The register clear must be held inactive during these transitions.

If testing is being performed by a manufacturer, the manufacturer may use automated test equipment to ensure that appropriate clock and clear signals are applied to registers 207 to avoid data corruption. Logic such as clock and clear control logic 211 may be provided on the device if it is desired for users without access to such test equipment to be able to test the device. Clock and clear control logic 211 receives information on the state of switching circuit 196' via line 213. Clock and clear control logic 211 also receives control signals via line 215 that may be used to instruct clock and clear control logic when to apply the clocks received via lines 209a, 209b, and 209c to clock line 217. Clock and clear control logic 211 distributes clear signals to registers 207 on clear line 219. Clock and clear control logic 211 also ensures that the clear signal on clear line 219 is held inactive during transitions and ensures that the clock signals provided to clock line 217 are such that the contents of registers 207 are not corrupted during transitions. Moreover, clock and clear control logic 211 ensures that the clear signals applied to line 219 are held inactive during intialization and scan mode.

Figure 7C:
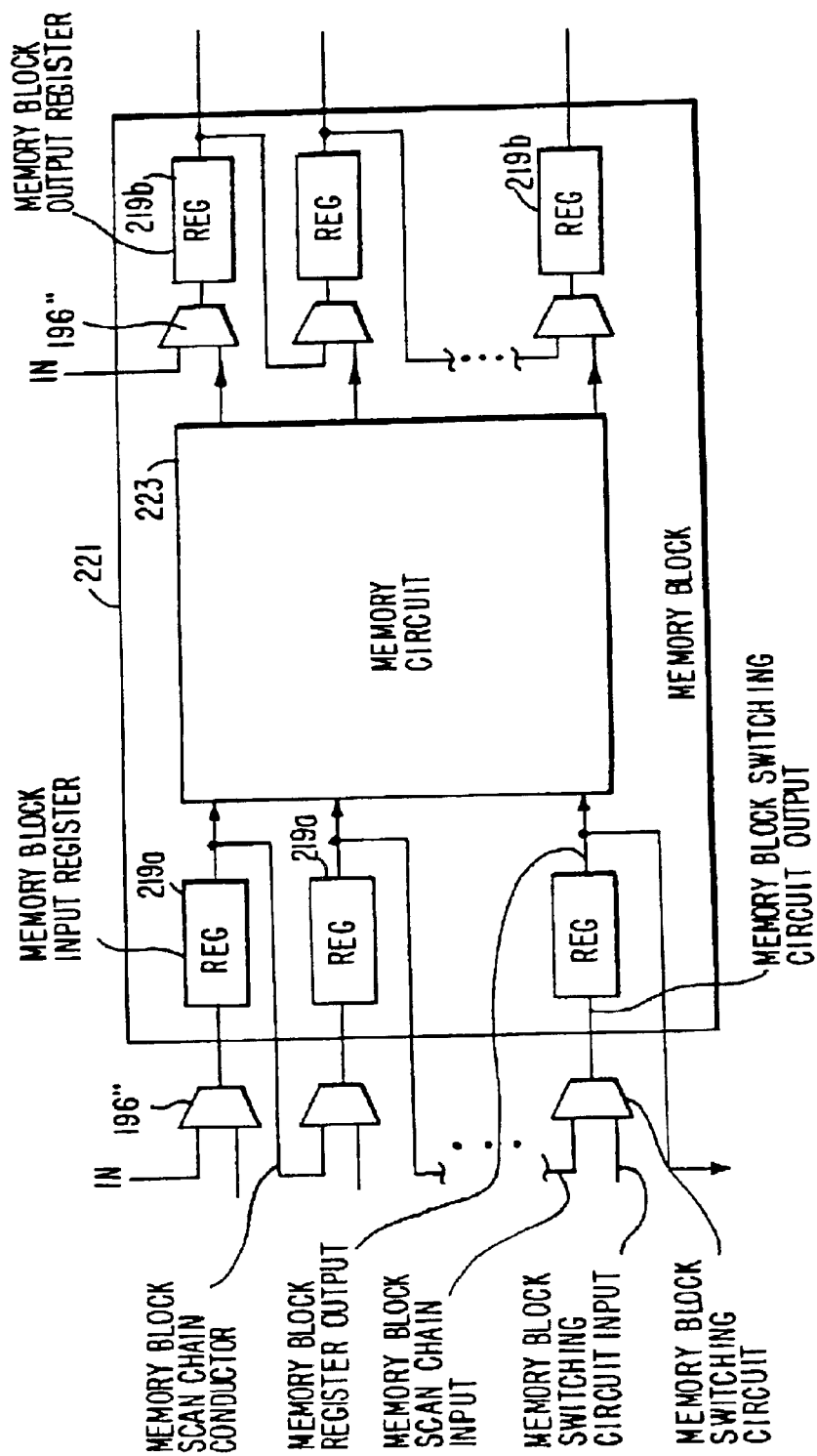
FIG. 7c is a diagram illustrating how memory block registers may be interconnected by switching circuits to form chains in accordance with the present invention.

As shown in FIG. 7c, switching circuits 196″ can be used to form one or more chains of memory block input registers 219a and memory block output registers 219b. Memory block 221 contains memory circuit 223 which contains a memory array. Memory block registers 219a and 219b may be the registers used at the inputs and outputs of memory circuit 223.

Memory block scan chain conductors are used to connect the output of each memory block register to the memory block scan chain input of a memory block switching circuit associated with a successive one of the memory block registers, thereby forming a continuous scan chain. During normal operation, each memory block switching circuit 196″ is configured to connect its memory block switching circuit input to its memory block switching circuit output so that memory block signals are stored in the memory block registers. During register observation each memory block switching circuit is configured to connect its memory block scan chain input to its memory block switching circuit output so that the memory block signals stored in the registers may be scanned out of the registers through the continuous scan chain. Initialization data may also be supplied through the scan chain if desired.

FIG. 7d shows how a scan chain using the switching circuits of the type shown in FIGS. 7a, 7b, and 7c may be formed from input/output registers 225, logic element registers 207, and memory block registers 219.

When a memory block such as memory block 221 of FIG. 7c is provided in a GOL such as one of GOLs 22 of FIG. 1, the memory block may sometimes be referred to as an embedded array block (EAB). As shown in FIG. 7e, test chains may be formed by connecting the logic element registers in the logic array blocks 18 and embedded array blocks 221' that are contained in the GOLs 22 in a particular row on a programmable logic device. If a number of such chains are formed, each in a row of GOLs 22, testing (i.e., both initialization and logic signal observation) may be performed in each of the rows in parallel, thereby increasing testing throughput.

Another aspect of the invention relates to using the first-in-first-out (FIFO) programming memory cell chains on a programmable logic device to either load initialization data or to scan out logic signals for observation during testing. Programmable logic device FIFO chains are used for configuring programmable logic devices to perform desired logic functions. A user may load programming data into the FIFO chains using a programmer. The programming data in each memory cell in the chain causes that cell to turn on or to turn off an associated programmable connector (e.g., a transistor). By providing all such FIFO cells with appropriate programming data, the user may configure the programmable logic device.

Figure 8:
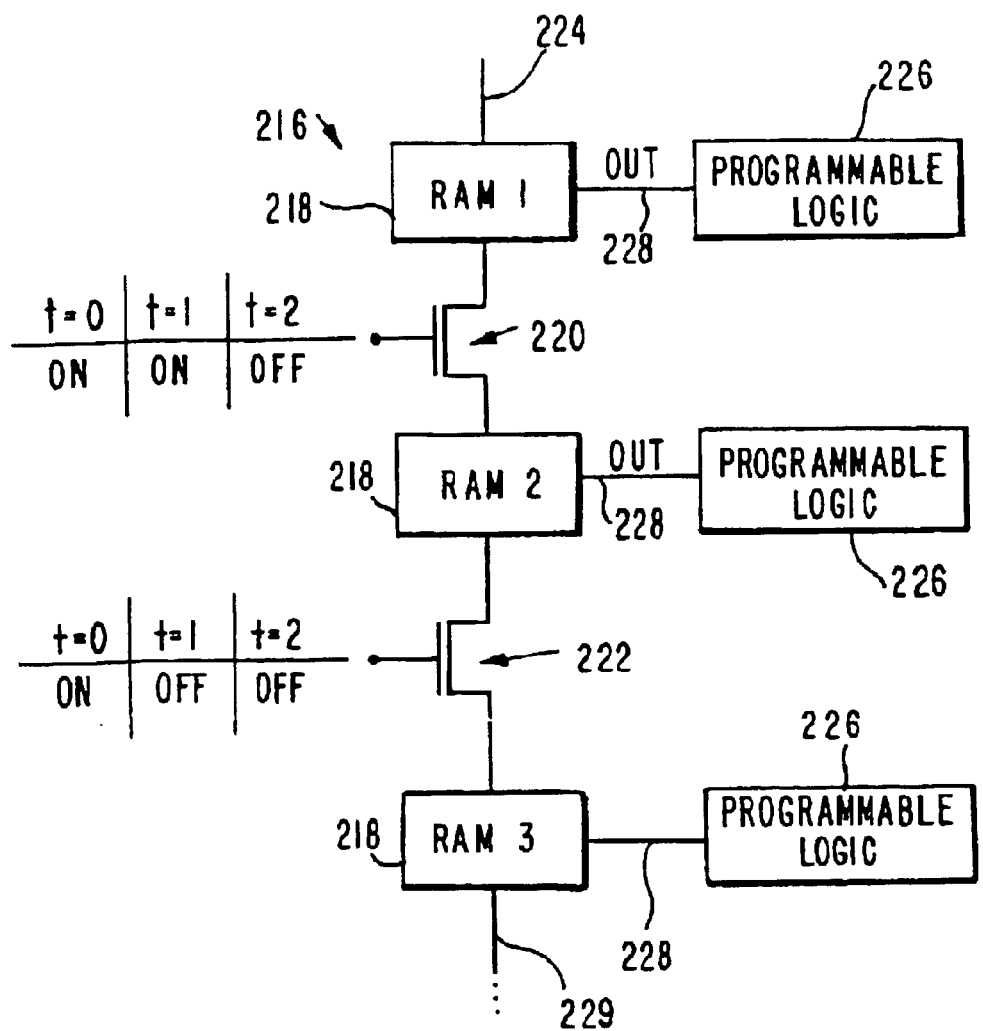
FIG. 8 is a diagram of a conventional first-in-first out chain of memory cells whose outputs are used to configure programmable logic within various programmable logic elements.

A small portion of a typical programmable logic device FIFO chain is shown in FIG. 8. FIFO chain 216 contains FIFO memory cells such as random access memory (RAM) cells 218 or other suitable memory cells. RAM cells 218 are interconnected by transistors such as transistors 220 and 222, which control the loading of data provided at input pin 224. At time t=0, transistors 220 and 222 are on, so that the first bit of programming data applied to input 224 is stored in memory cell RAM 3. Transistor 222 is then turned off (t=1), so that the next bit of programming data applied to input 224 is stored in memory cell RAM 2. At time t=2, transistor 220 is turned off, so that the next bit of programming data applied to input 224 is stored in memory cell RAM 1. After each of the memory cells 218 has been loaded with programming data, the programming process is complete. The programming data stored in each cell produces a corresponding output signal (i.e., a logical high if a one is stored or a logical low if a zero is stored). The output signals from each memory cell 218 are applied to an associated region of programmable logic 226 via an output line 228. Programmable logic 226 contains programmable components (e.g., transistors) that are configured (e.g., turned on or off) based on the programming data applied via lines 228. Programmable logic devices typically have a large number of memory cells such as memory cells 218 arranged in a number of FIFO chains passing through various regions of the device. When it is desired to unload programming data from cells 218 (e.g., to verify the programming data and thereby test the chain), transistors 222 and 220 are activated in reverse order and the data is provided at output 229.

Figure 9:
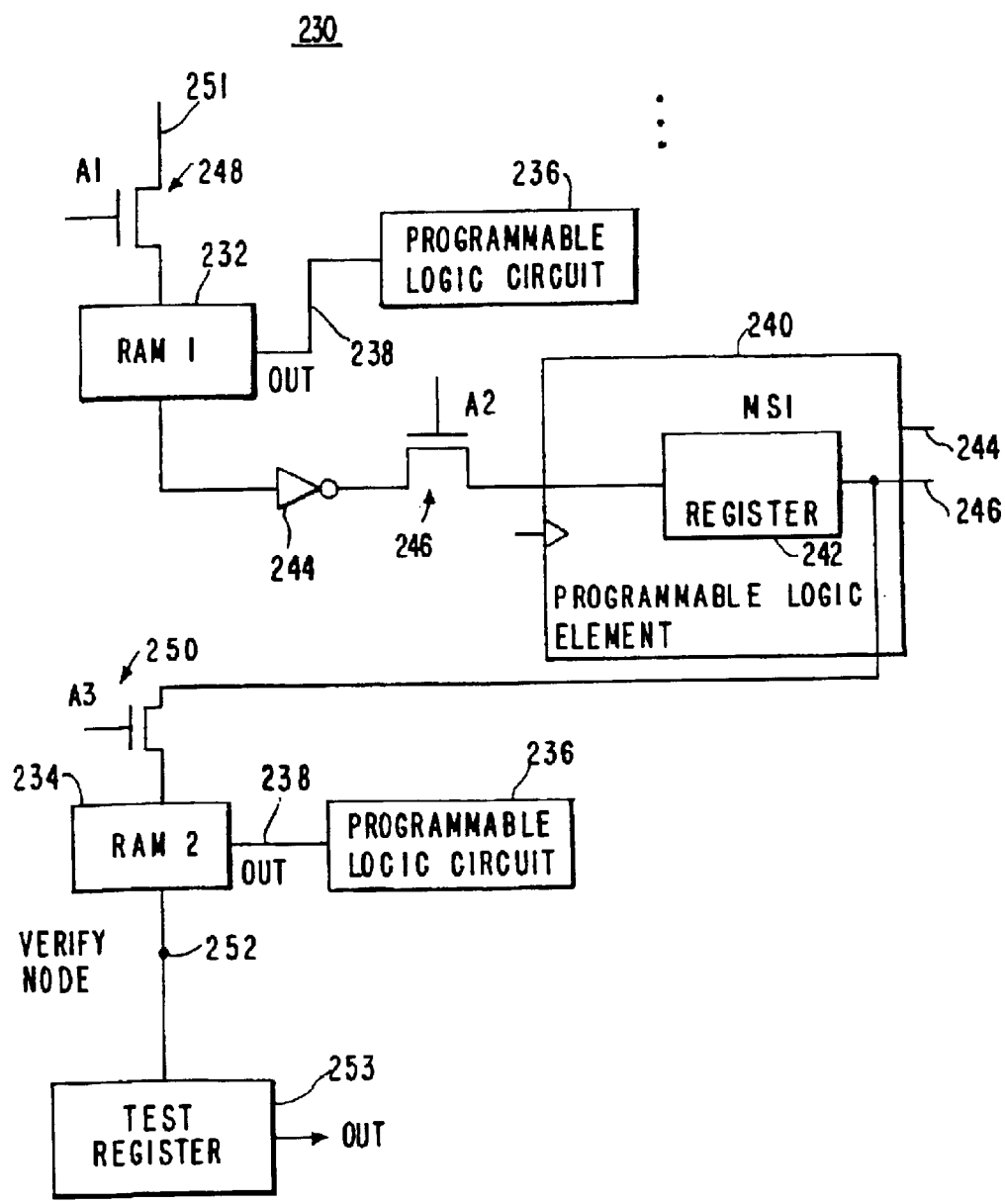
FIG. 9 is a diagram of a portion of an illustrative first-in-first-out programming chain into which a logic element register has been incorporated so that logic signals from that register may be observed in accordance with the present invention.

As shown in FIG. 9, a programmable logic device FIFO chain may be modified in accordance with the present invention to incorporate logic element registers (such as register MS 1) into the existing FIFO chain (shown as memory cells RAM 1 and RAM 2). Logic signals from the registers may be observed by scanning these signals out through the FIFO chain. An advantage of this approach for logic signal observation is that it makes use of the FIFO programming resources that already exist on the device.

Only a short bottom portion of a FIFO chain is shown in FIG. 9 to avoid over-complicating the drawings. However, numerous memory cells and programmable logic element registers are typically connected in the chain. It is not necessary or typical that there be a programmable logic element register 242 between each pair of memory cells. Rather, the number of programmable logic element registers 242 that are inserted into the FIFO chain depends on the number of programmable logic element registers 242 relative to the number of FIFO cells used on a given programmable logic device. Any suitable number of programmable logic element registers may be connected in the chain.

In circuitry 230 of FIG. 9, FIFO memory cells 232 and 234 are connected to associated programmable logic circuits 236 via output lines 238. Programmable logic circuits 236 may be any suitable type of programmable logic that may be configured by a programmable memory cell bit. The outputs of FIFO memory cells 232 and 234 configure programmable logic circuits 236 (e.g., by turning on or off transistors contained in logic circuits 236).

The outputs of the FIFO memory cells are also generally applied to programmable logic circuitry within programmable logic element 240 to configure the logic functions performed by logic element 240. Logic element 240 may be any suitable type of programmable logic device logic element that contains an appropriate register 242. For example, logic element 240 may be interconnected (via outputs 244 and 246) with various global and local conductors in a programmable logic device arrangement such as shown in FIG. 1. If desired, logic element 240 may contain a look-up table and multiplexing circuitry of the type shown in the logic element arrangements of FIGS. 4–6.

Logic element register 242 is made part of the programming FIFO chain containing memory cells 232 and 234 by routing signals from memory cell RAM 1 to logic element register 242 via buffer 244 and transistor 246. Transistor 246 is used with transistors 248 and 250 when loading programming data into the FIFO made up of memory cell RAM 1, register MS 1, and memory cell RAM 2. Data is loaded into this FIFO chain from input 251. Data is loaded into memory cell RAM 2 when transistors A1, A2, and A3 are on, into register MS 1 when A1 and A2 are on, and into memory cell RAM 1 when A1 is on. Data (including the contents of register MS 1 that is to be observed) may be unloaded from the FIFO chain of FIG. 9 into test register 253 at output (verify node) 252 by activating transistors 248, 246, and 250 in the reverse order of that used when loading programming data into the chain.

Figure 10A:
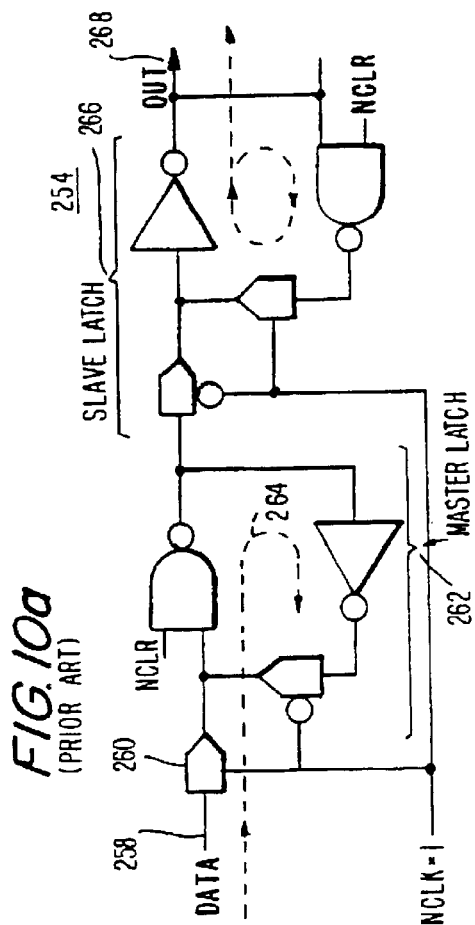
FIGS. 10a and 10b are diagrams of conventional register circuitry of a type that may be used with the present invention.
Figure 10B:
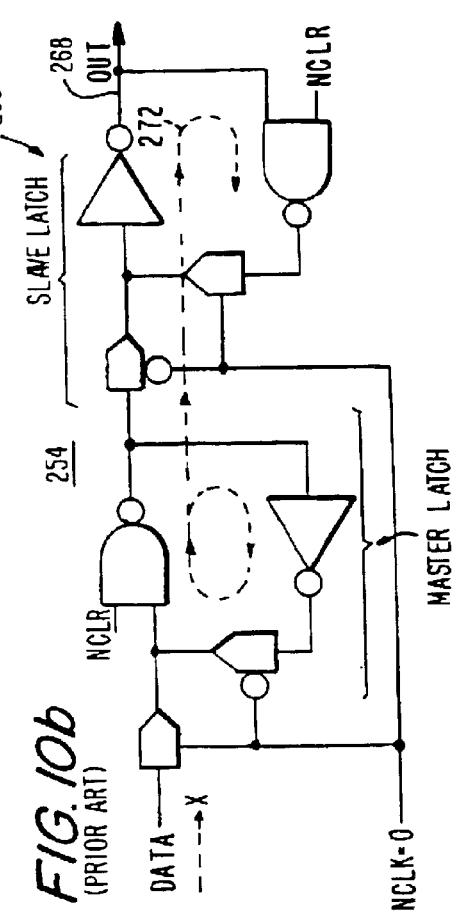
Figure 10C:
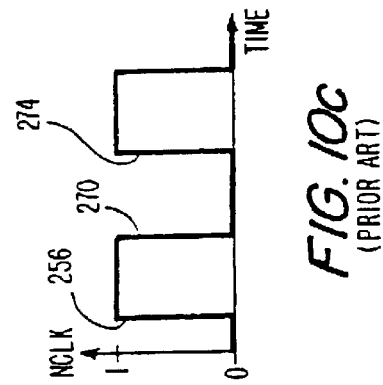
FIG. 10c is a diagram of the NCLK signal used in operating the register circuitry of FIGS. 10a and 10b.

The basic operation of an illustrative register 254 suitable for use as register MS 1 is shown in FIGS. 10*a* and 10*b*. The register design shown in FIGS. 10*a* and 10*b* is in itself well known. As shown in FIG. 10*a*, when signal NCLK goes high in this type of register (edge 256 in FIG. 10*c*), data at input 258 is passed through gate 260 to master latch 262 (as shown by dotted line portion 264 in FIG. 10*a*). At the same time, data previously stored in slave latch 266 (FIG. 10*a*) is provided at output 268. When NCLK falls to zero (edge 270 in FIG. 10*c*), the data shown as dotted line portion 264 in FIG. 10*a* is passed to slave 266, as shown by dotted line portion 272 in FIG. 10*b*. When NCLK rises again (edge 274 in FIG. 10*c*), the data shown as dotted line portion 272 in FIG. 10*b* is passed to output 268.

Register MS 1 of FIG. 9 may be connected to the chain of FIFO memory cells in different ways. One suitable way in which to connect register MS 1 is shown in FIG. 11. In the FIG. 11 arrangement, the output of RAM 1 (FIG. 9) is applied to master latch 276 of register MS 1 of FIG. 11 at node 278 using buffer 244 and pass transistor 246.

FIG. 12 is a timing diagram showing the operation of the FIG. 11 arrangement. At t=0, register MS 1 of FIG. 11 is in a power-up state, waiting to be programmed (initialized). At t=1, preparations are made for programming by taking NCLK to zero and applying data to input 251 of FIG. 9. Because transistors A1, A2, and A3 are on (as indicated by the ones associated with these transistors in the t=1 column), the data applied to input 251 passes through memory cell RAM 1 and register MS 1 into memory cell RAM 2. This is indicated by the entry D3 in the row for RAM 2 in the t=1 column of FIG. 12.

During times t=2, t=3, and t=4, the rest of the FIFO chain of FIG. 9 using the FIG. 11 arrangement for register MS 1 is programmed by progressively turning off transistors A3, A2, and A1. The resulting respective data entries D1, D2, and D3 for RAM 1, MS 1, and RAM 2 are shown in the column for t=4 in FIG. 12. At time t=5 a transition to user mode is made. From t=6 to t=10 the device is in user mode and operates normally. (The time t=10 at the end of user mode is illustrative only—any suitable number of user mode clock cycles may exist between time t=6 and the end of user mode.)

The entries in the column for t=10 in FIG. 12 represent the state of the FIFO chain at the end of user mode. Note that the data in register MS 1 at time t=10 (D2') may be different than the data in register MS 1 at time t=5 (D2).

At time t=11, register MS 1 is isolated by taking NCLK to zero. In addition, NCLR (an active low signal) is taken to one, so that register MS 1 is not cleared.

Verify mode begins at time t=12. At times t=13, t=14, and t=15 data is unloaded from the FIFO chain (i.e., from memory cell RAM 1, register MS 1, and RAM 2) via output (verify node) 252 (FIG. 9) by progressively turning on transistors A3, A2, and A1.

There may be some data loss with the arrangement of FIG. 11 when leaving user mode (i.e., when entering verify mode). In particular, because the state of NCLK is not known at time t=10, it is possible that data D2' in register MS 1 will not be valid at time t=11. If NCLK at t=10 is zero, then data D2' at time t=11 will be valid. If NCLK at t=10 is one (i.e., user clock is one), then data D2' at time 11 will be corrupted. This is indicated in box 280 in the table of FIG. 13. Box 280 appears under the heading "negative edge triggered" because the foregoing discussion of the FIG. 11 arrangement pertains to a negative edge triggered register. Data loss will also be experienced upon entering verify mode using a positive edge triggered register whenever NCLK at t=10 is one (i.e., user clock is zero), as shown in box 282.

Figure 14:
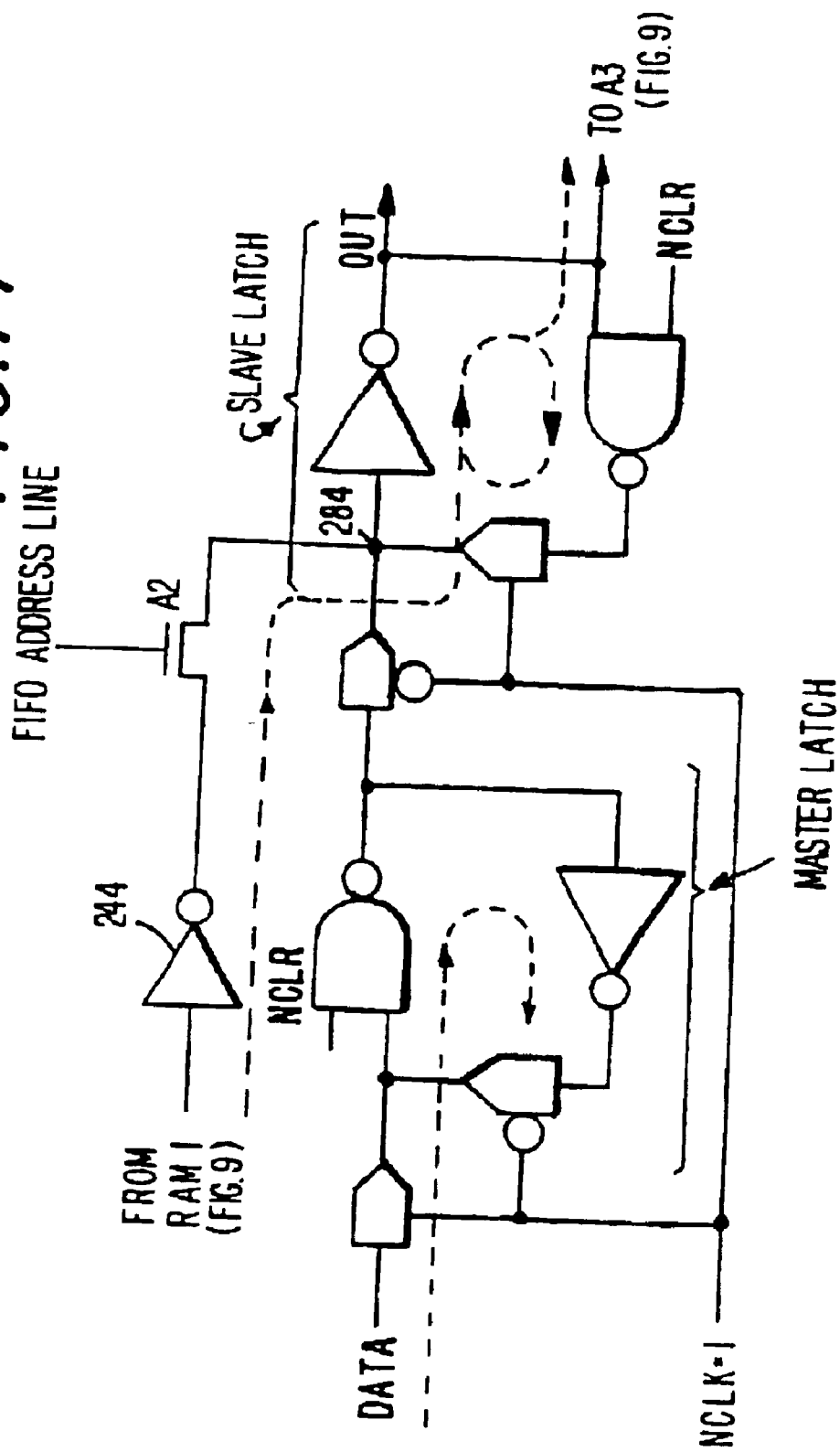
FIG. 14 is a diagram of additional illustrative register circuitry that may be used in a first-in-first-out programming chain in accordance with the present invention.

Another suitable way in which register MS 1 may be connected to the FIFO chain is shown in FIG. 14. In the FIG. 14 arrangement, data from RAM 1 is applied to the slave latch portion of register MS 1 at node 284 via pass transistor A2 and buffer 244.

FIG. 15 is a timing diagram showing the operation of the FIG. 14 arrangement. At t=0, register MS 1 of FIG. 14 is in a power-up state, waiting to be programmed (initialized). At t=1, preparations are made for programming by taking NCLK to one and applying data to input 251 of FIG. 9. Because transistors A1, A2, and A3 are on (as indicated by the ones associated with these transistors in the t=1 column), the data applied to input 251 passes through memory cell RAM 1 and register MS 1 into memory cell RAM 2. This is indicated by the entry D3 in the row for RAM 2 in the t=1 column of FIG. 15.

During times t=2, t=3, and t=4, the rest of the FIFO chain of FIG. 9 using the FIG. 14 arrangement for register MS 1 is programmed by progressively turning off transistors A3, A2, and A1. The resulting respective data entries D1, D2, and D3 for RAM 1, MS 1, and RAM 2 are shown in the column for t=4 in FIG. 15. At time t=5 a transition to user mode is made. From t=6 to t=10 the device is in user mode and operates normally. (The time t=10 at the end of user mode is illustrative only—any suitable number of user mode clock cycles may exist between time t=6 and the end of user mode.)

The entries in the column for t=10 in FIG. 15 represent the state of the FIFO chain at the end of user mode. Note that the data in register MS 1 at time t=10 (D2') may be different than the data in register MS 1 at time t=5 (D2).

At time t=11, register MS 1 is isolated by taking NCLK to one. In addition, NCLR (an active low signal) is taken to one, so that register MS 1 is not cleared.

Verify mode begins at time t=12. At times t=13, t=14, and t=15 data is unloaded from the FIFO chain (i.e., from memory cell RAM 1, register MS 1, and RAM 2) via output (verify node) 252 (FIG. 9) by progressively turning on transistors A3, A2, and A1.

There may be some data loss with the arrangement of FIG. 14 when entering user mode. In particular, because the state of NCLK is not known at time t=5, it is possible that data D2 in register MS 1 will not be valid at time t=5. If NCLK at t=5 is held at one, then data D2 at time t=5 will be valid. If NCLK at t=5 is taken to zero (i.e., user clock is zero), then data D2 at time t=5 will be corrupted. This is indicated in box 286 of FIG. 16. Box 286 appears under the heading "negative edge triggered" because the foregoing discussion of the FIG. 14 arrangement pertains to a negative edge triggered register. Data loss will also be experienced upon entering user mode using a positive edge triggered register whenever NCLK at t=5 is zero (i.e., user clock is one), as shown in box 288.

The scheme of FIG. 14 inserts data from the FIFO chain into the slave portion of master-slave register MS 1, rather than into the master portion as in the FIG. 11 scheme. As a result, NCLK must be forced to one in the FIG. 14 scheme upon entering program mode (t=1) and upon entering verify mode (t=11) rather than forced to zero as with the FIG. 11 scheme. The data in master slave register MS 1 may still be corrupted in the FIG. 14 scheme. However, this occurs at the transition from programming mode to user mode rather than at the transition from user mode to verify mode as in the FIG. 11 scheme.

Figure 17:
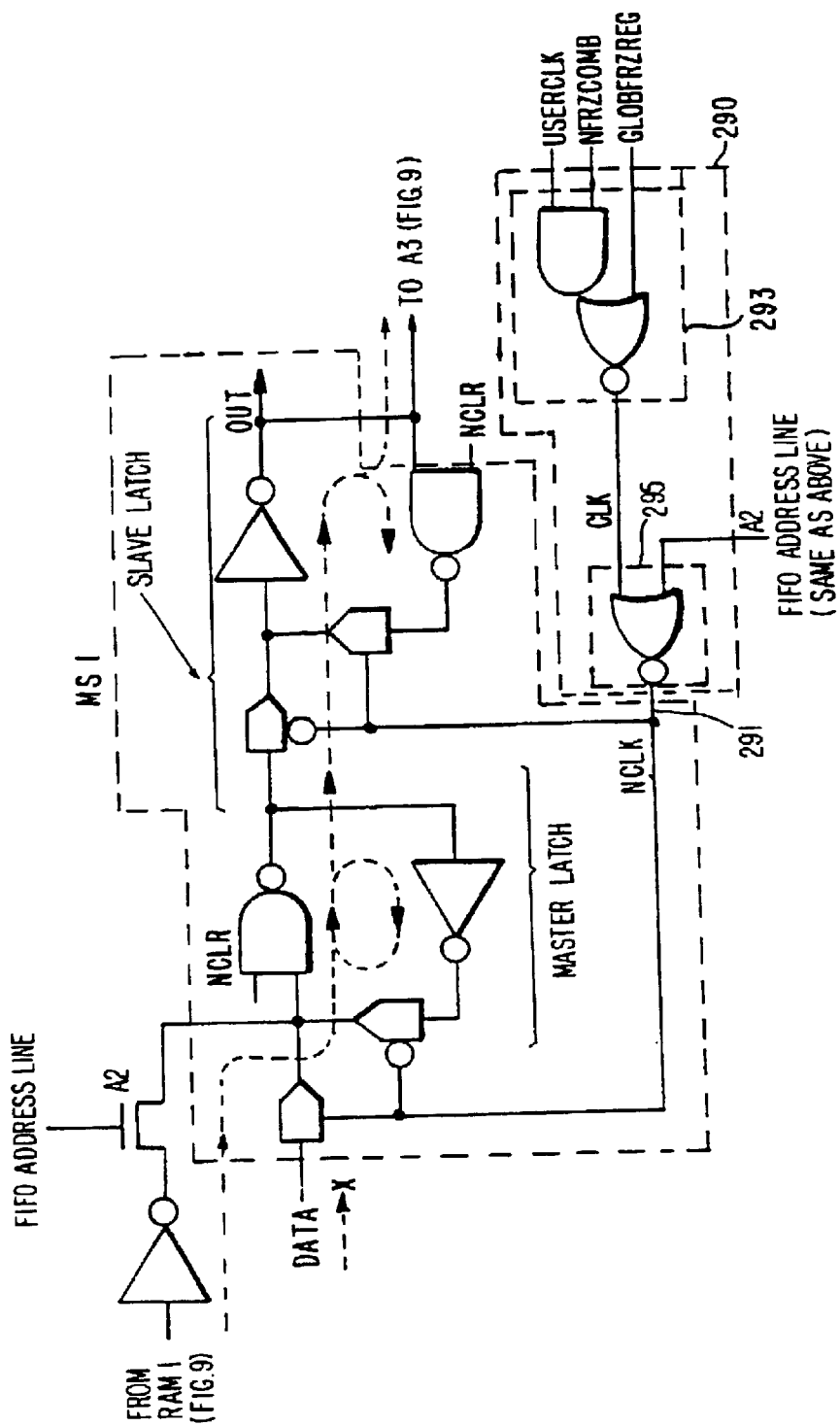
FIG. 17 is a diagram of additional illustrative register circuitry that may be used in a first-in-first-out programming chain in accordance with the present invention.

An improved version of the arrangements of FIGS. 11 and 14 that avoids hazards present in those arrangements is shown in FIG. 17. Clock control logic 290 is used to control the state of the NCLK signal that is applied to clock input 291. Clock control logic contains user clock control logic 293, which is driven by global freeze signal GLOBFRZREG and signal NFRZCOMB, and address line clock control logic 295, which is driven by signal A2. Using clock control logic 290 avoids the possibility of corrupting initialization data in register MS 1 upon entering user mode and allows a smooth transition into the unload (verify) mode when the outputs of such logic element registers are to be observed. With the FIG. 17 arrangement, signals can be observed on programmable logic devices that contain both positive edge triggered registers and negative edge triggered registers without data corruption. Only a single unload operation is necessary to observe all registers. With the arrangements of FIGS. 11 and 14, it is necessary to perform two such operations—one to observe positive edge triggered registers on the device without possibility of data corruption and one to observe negative edge triggered registers on the device without possibility of data corruption.

FIG. 18 is a timing diagram showing the operation of the FIG. 17 arrangement. At time t=0, the FIFO chain of FIG. 17 is in a power-up state, waiting to be programmed (initialized). At t=1, data is loaded into memory cell RAM 2 by applying data to input 251 (FIG. 9). Because transistors A1, A2, and A3 are on (as indicated by the ones associated with these transistors in the t=1 column), the data applied to input 251 passes through memory cell RAM 1 and register MS 1 into memory cell RAM 2. This is indicated by the entry D3 in the row for RAM 2 in the t=1 column of FIG. 18.

Figure 19:
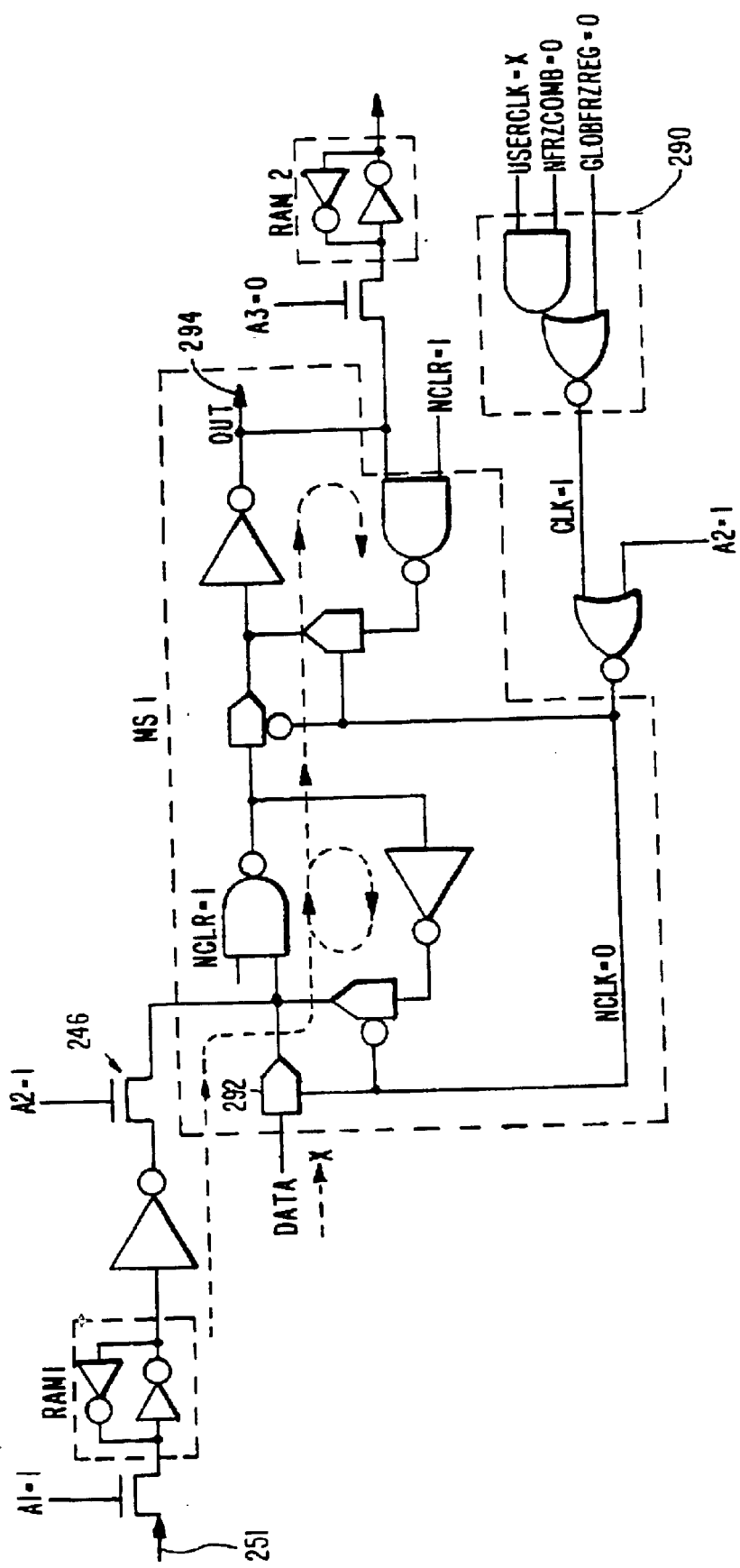
FIG. 19 is a diagram showing the operation of the FIG. 17 arrangement at time t=2 in accordance with the present invention.

As shown in FIG. 19, at time t=2, memory cell RAM 2 is isolated by taking A3 to zero (turning off the associated pass transistor). Valid data (D2) is loaded into the slave portion of register MS 1 because A1 and A2 are one (turning on the associated pass transistors). NFRZCOMB and GLOBFRZREG are zero at t=2, which assures that CLK=1 and NCLK is therefore held at zero. The path from DATA to register MS 1 is thus blocked (gate 292 is off) while the path from memory cell RAM 1 is connected to register output 294 (because transistor 246 is on). This allows register MS 1 to be preloaded.

Figure 20:
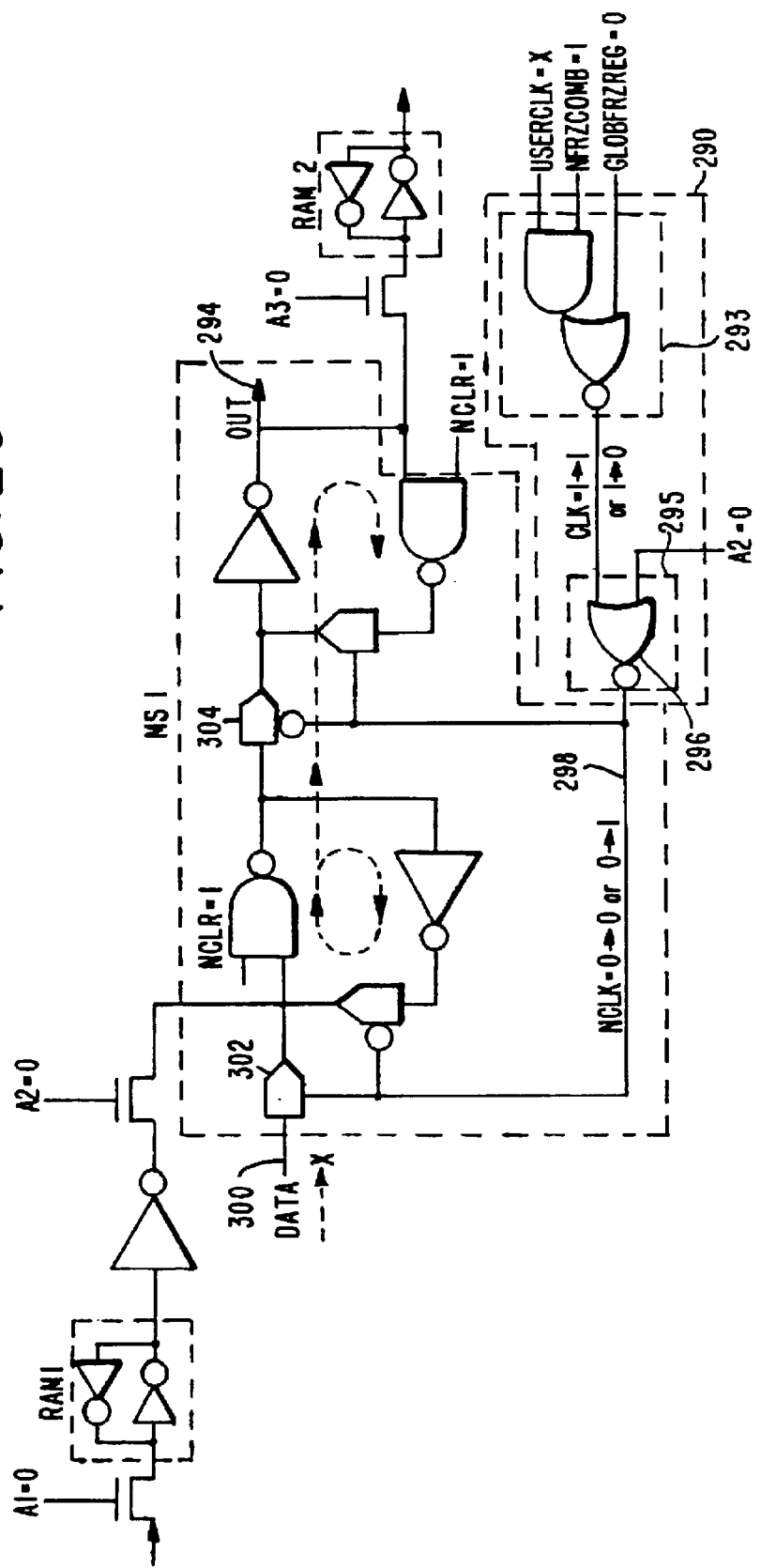
FIG. 20 is a diagram showing the operation of the FIG. 17 arrangement at time t=5 in accordance with the present invention.

At time t=5, a transition to user mode is made without disrupting the data loaded into register MS 1, as shown in FIG. 20. GLOBFRZREG is zero and NFRZCOMB is one, so that the signal USERCLK propagates through user clock control logic 293 and is applied (as the CLK signal) to gate 296 of address line clock control logic 295. A2 is zero, so that NCLK on line 298 at the output of address line clock control logic 295 is the inverse of CLK. If NCLK makes a zero to zero transition, DATA at line 300 will not be connected to output 294 because gate 302 will be off. If NCLK makes a zero to one transition, the slave portion of register MS 1 will be isolated from the master portion of register MS 1 because gate 304 will be off.

As shown in FIG. 18, from t=6 to t=10 the device is in user mode and operates normally. (The time t=10 at the end of user mode is illustrative only—any suitable number of user mode clock cycles may exist between time t=6 and the end of user mode.) Note that the data in register MS 1 at time t=10 (D2') may be different than the data in register MS 1 at time t=5 (D2).

Figure 21:
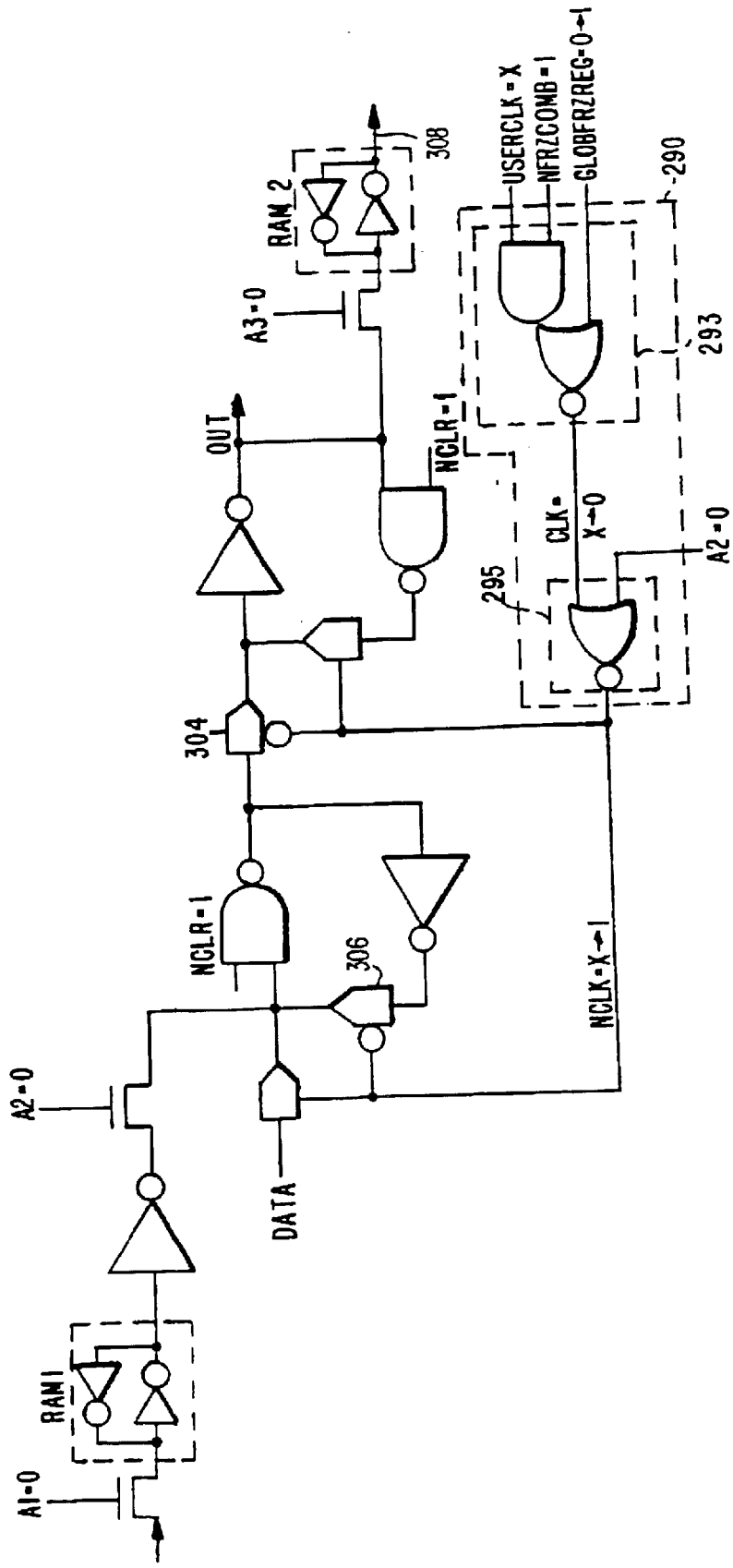
FIG. 21 is a diagram showing the operation of the FIG. 17 arrangement at time t=11 in accordance with the present invention.

At time t=11, GLOBFRZREG is taken to one, thereby forcing NCLK to one, turning off gates 304 and 306, and isolating the slave portion of register MS 1 from the master portion of register MS 1, as shown in FIG. 21. Because NCLK is forced to one, the possible corruption of data D2' in register MS 1 that was encountered with the arrangement of FIG. 11 is avoided. It is therefore not necessary to perform separate unloading operations to observe signals in devices containing both positive edge triggered registers and negative edge triggered registers.

Verify mode begins at time t=12. At times t=13, t=14, and t=15 data is unloaded from the FIFO chain (i.e., from memory cell RAM 1, register MS 1, and RAM 2) via output 308 (which is connected to verify node 252 of FIG. 9) by progressively turning on transistors A3, A2, and A1. Data may be unloaded into test register 253 (FIG. 9). Data from the test register may be shifted onto output pins such as the test data out (TDO) pin of FIG. 2.

Because the arrangements of FIGS. 11, 14, and 17 allow data to be preloaded into registers MS 1 during configuration of the programmable logic device, the user can initialize the device to various conditions during device testing.

Figure 22:
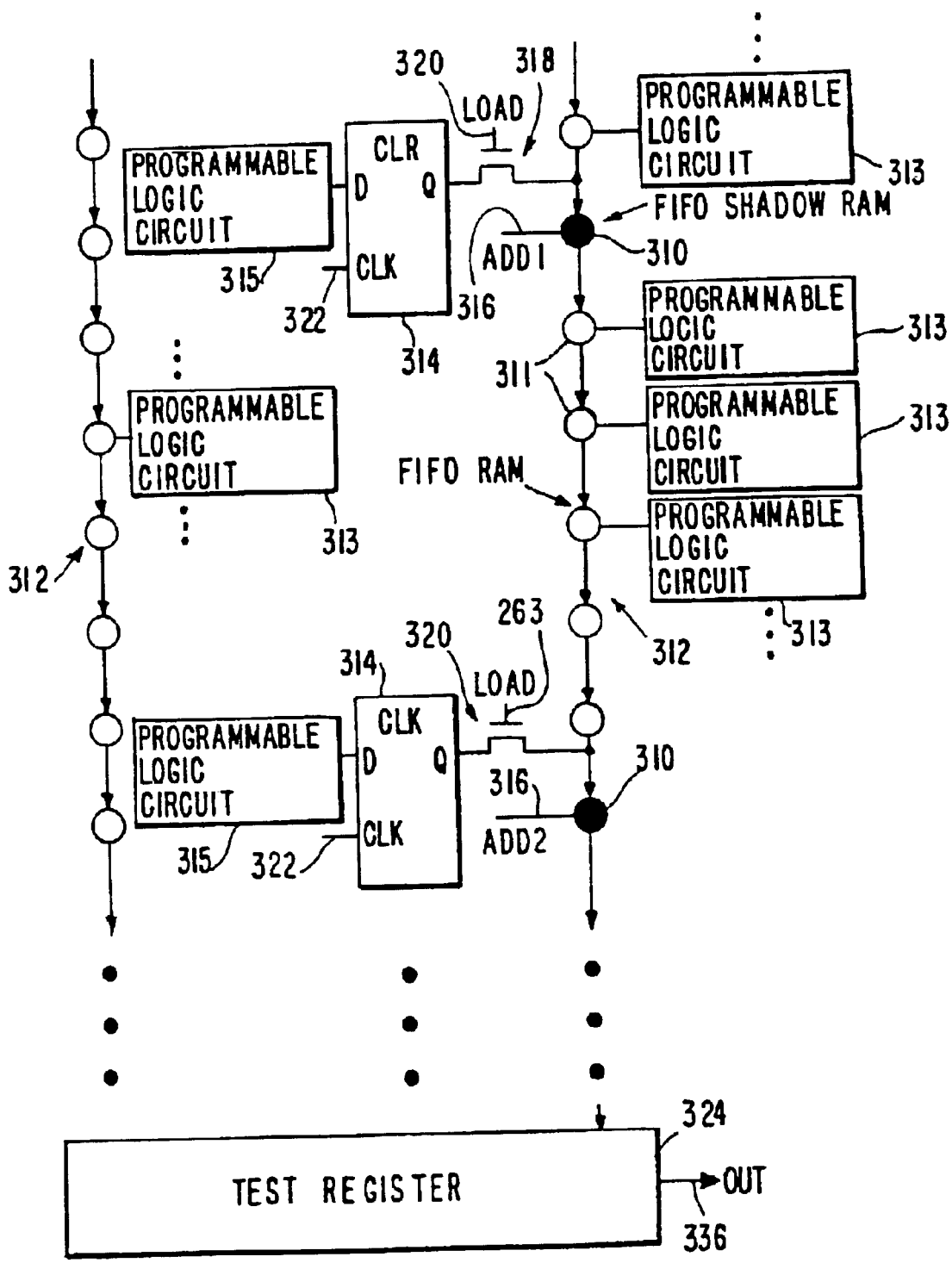
FIG. 22 is a diagram of illustrative circuitry in which a first-in-first-out chain having shadow memory cells is used for observing programmable logic circuit signals on a programmable logic device in accordance with the present invention.

Another aspect of the invention relates to using shadow memory cells 310 in first-in-first-out (FIFO) programming memory cell chains 312 on a programmable logic device, as shown in FIG. 22. With the approach of FIG. 22, every logic element register 314 on the programmable logic device preferably has an associated shadow memory cell 310 (e.g., a random-access memory cell) that is not directly connected to any associated programmable logic circuit for configuring its programmable logic. Because shadow memory cells 310 are not directly connected to any programmable logic circuits like regular FIFO memory cells 311, data can be loaded into shadow memory cells 310 for observation without altering the logic configuration of any of the programmable logic circuits on the programmable logic device. Shadow memory cells 310 each have an associated address line 316 and an associated load transistor 318 controlled by a load line 320 for selectively conveying data to be observed from logic element registers 314 to shadow memory cells 310. Clock signals are applied to registers 314 at clock terminals 322. Once loaded, the contents of shadow memory cells 310 may be observed by unloading FIFO chains 312 into test register 324.

Each cell in chains 312 other than shadow memory cells 310 is typically connected to a programmable logic circuit 313 for configuring the programmable logic in that circuit. Each programmable logic circuit 313 may contain, for example, logic element register and look-up table logic. Only a few such logic circuits 313 are shown in FIG. 22 to avoid over-complicating the drawing. Registers 314 receive data from logic circuitry such as programmable logic circuits 315 (which may be the same as logic circuits 313). Each logic element register 314 is preferably contained within a logic element such as one of the logic elements 12 that are shown in FIG. 1.

Figure 23:
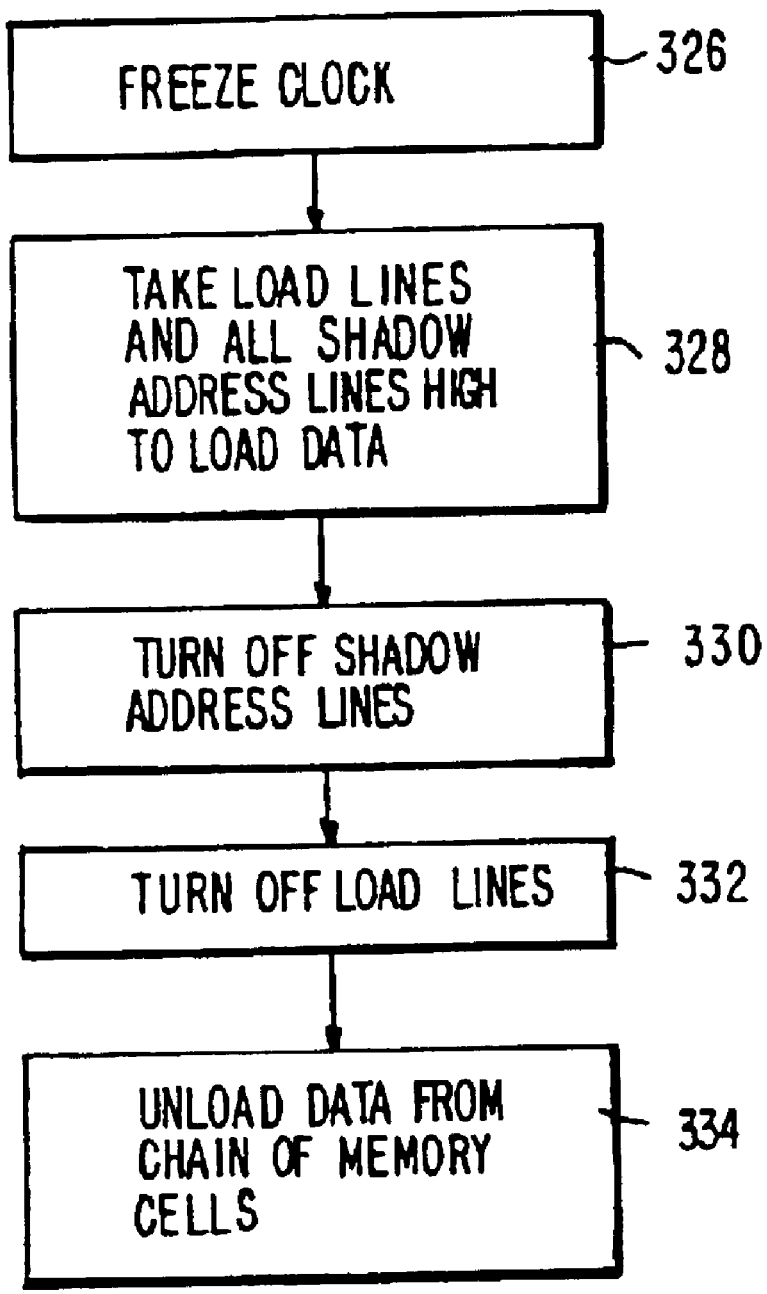
FIG. 23 is a flow chart of illustrative steps involved in using the FIG. 22 arrangement to observe logic signals in accordance with the present invention.

Steps involved in observing register signals using the arrangement of FIG. 22 are shown in the flow chart of FIG. 23. At step 326 of FIG. 23, the clock signals applied to clock terminals 322 are frozen. At step 328, load lines 320 and shadow address lines 316 are taken high globally to load the data to be observed from registers 314 to shadow memory cells 310. At step 330, shadow address lines 316 are taken low to isolate shadow memory cells 310 from the rest of the cells in FIFO chain 312. At step 332, load lines 320 are taken low to turn off load transistors 318 to isolate FIFO chains 312 from registers 314. At step 334, the data in FIFO chains 312 is unloaded into test register 324. The data stored in test register 324 can be read out of the programmable logic device (e.g., via output 336 of FIG. 22) for observation and analysis using the same type of circuitry normally used to read out test data from FIFO programming chain test registers on programmable logic devices without shadow memory cell capabilities.

Figure 24:
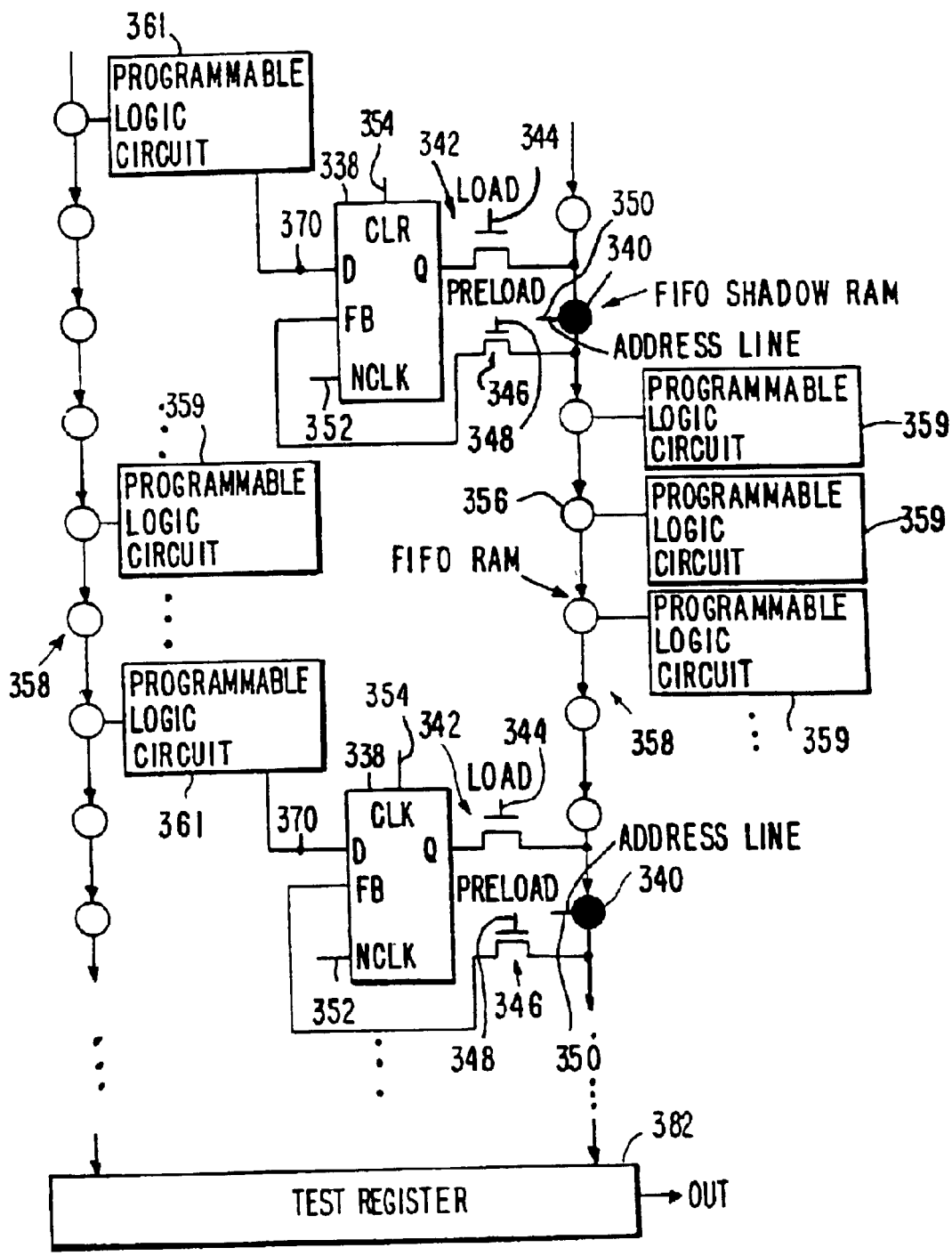
FIG. 24 is a diagram of illustrative circuitry in which a first-in-first-out chain having shadow memory cells is used for observing logic signals from programmable logic circuits and for preloading preload data into the programmable logic circuits on a programmable logic device in accordance with the present invention.
Figure 25:
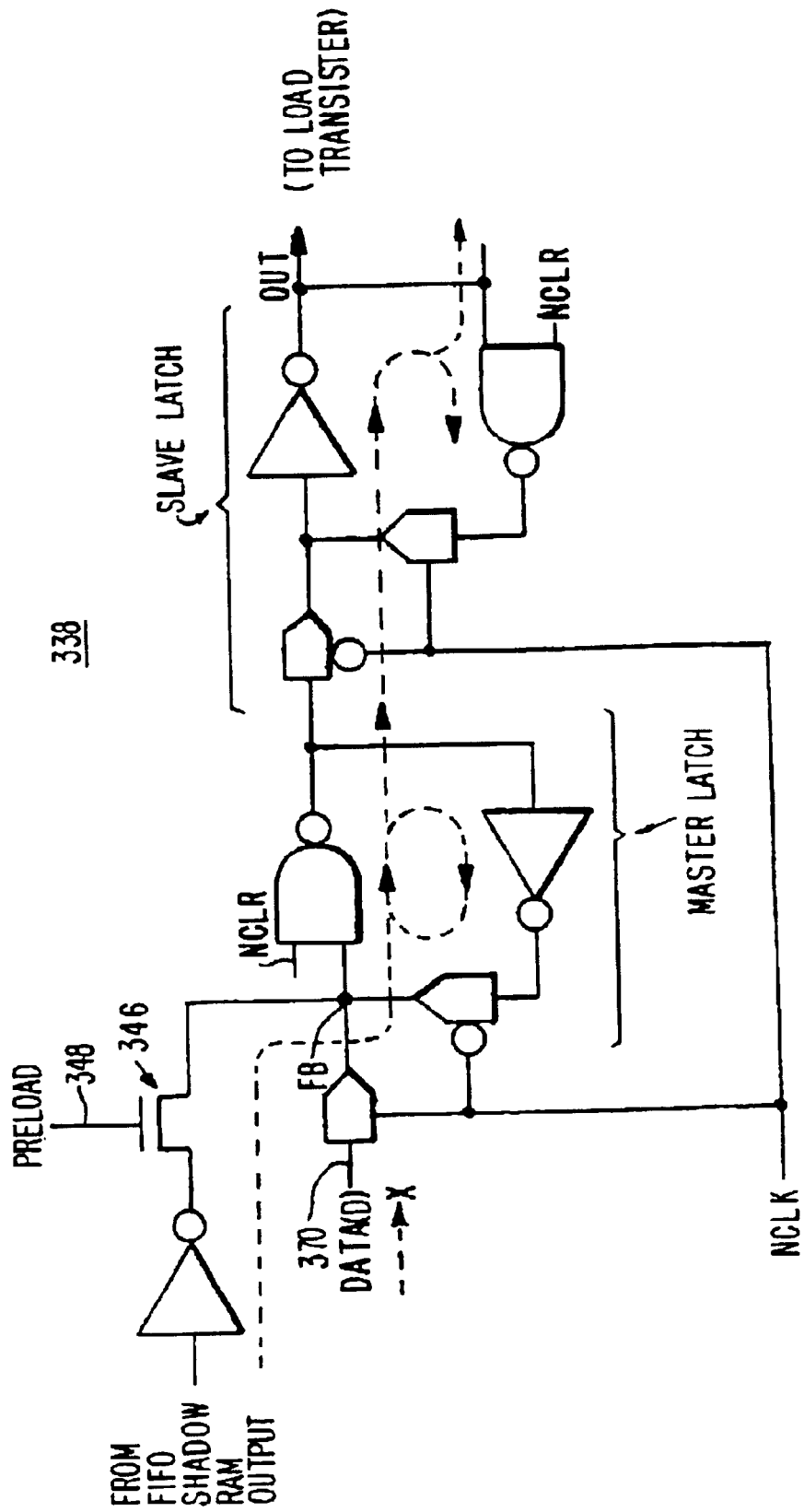
FIG. 25 is a diagram of illustrative register circuitry suitable for use in the arrangement of FIG. 24 in accordance with the present invention.

If desired, shadow memory cells in a FIFO chain may be used to preload registers. A suitable shadow memory cell arrangement that permits register preloading is shown in FIG. 24. In the FIG. 24 arrangement, logic element registers 338 each contain circuitry such as the circuitry shown in FIG. 25. Each shadow memory cell 340 (e.g., a shadow random-access memory cell) in FIG. 24 has an associated load transistor 342 controlled by a load line 344 for selectively conveying data to be observed to that shadow memory cell 340 from its associated logic element register 338. Each shadow memory cell 340 also has an associated preload transistor 346 controlled by a preload line 348 for selectively conveying preload data from that shadow memory cell 340 to its associated logic element register 338. In addition, each shadow memory cell 340 has an associated address line 350. Shadow memory cells 340 are not directly connected to any programmable logic circuits for configuring their programmable logic. Because shadow memory cells 340 are not directly connected to any programmable logic circuits like regular FIFO memory cells 356, data can be loaded into shadow RAM memory cells 340 for observation without altering the logic configuration of any of the programmable logic circuits on the programmable logic device. Clock signals are applied to clock terminals 352 and clear signals are applied to clear terminals 354. Feedback terminals FB receive data from preload transistors 346. Data terminals D receive data from logic circuitry elsewhere on the programmable logic device in which the FIG. 24 circuitry is contained. FIFO shadow memory cells 340 are connected to regular memory cells 356 (e.g., regular random-access memory cells) in FIFO memory cell programming chains 358, that in turn are connected to test register 382.

Each FIFO memory cell 356 in chains 358 other than the shadow memory cells 340 is typically connected to a programmable logic circuit 359 for configuring the programmable logic in that circuit. Each programmable logic circuit 359 may contain, for example, a logic element register such as one of registers 338 and lookup table logic. Only a few such logic circuits 359 are shown in FIG. 24 to avoid over-complicating the drawing. Logic element registers 338 receive data from logic circuitry such as programmable logic circuits 361. Preferably, logic element registers 338 and their associated programmable logic circuits 361 are each contained within a logic element such as one of logic elements 12, which are shown in FIG. 1. The circuitry of programmable logic circuits 361 therefore provides look-up table logic for the logic elements. Logic element registers 338 provide register logic for the logic elements.

Figure 26:
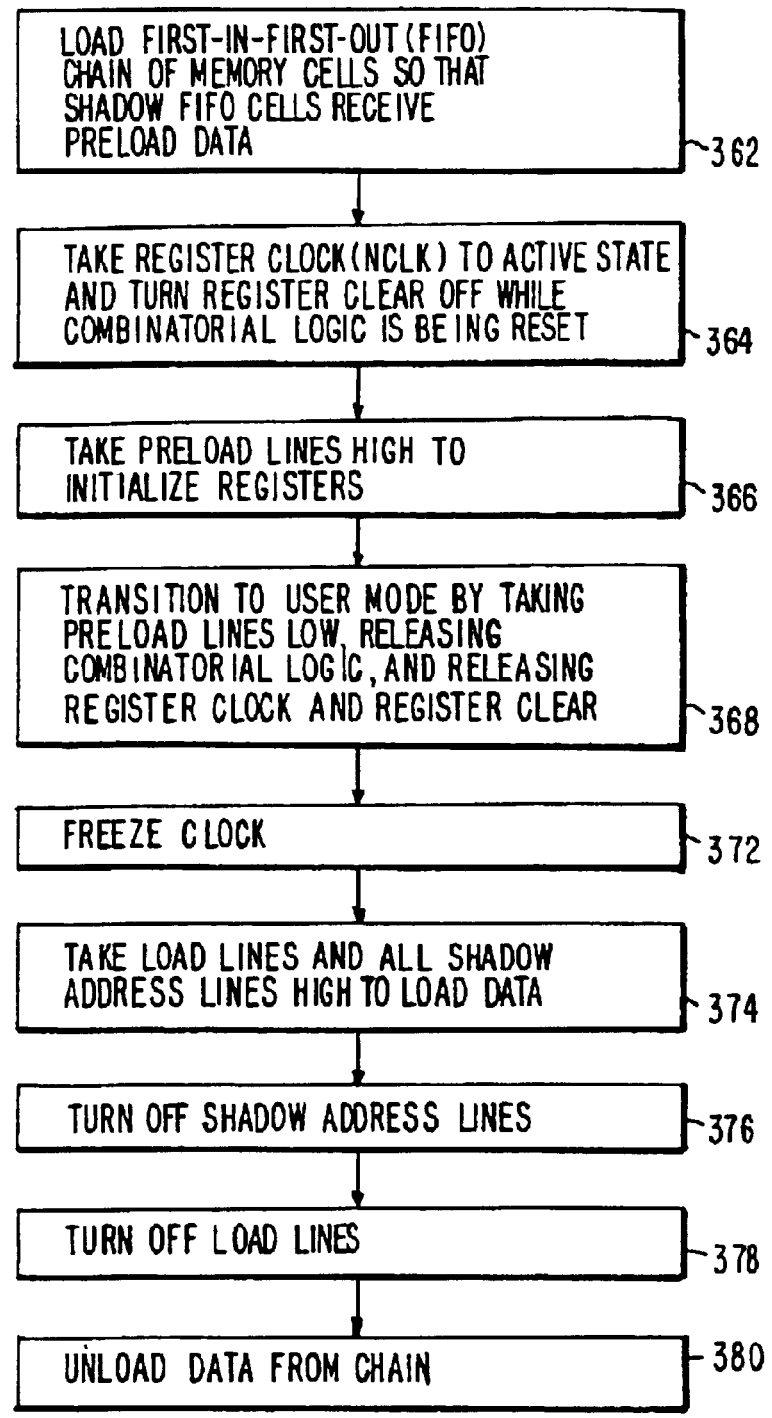
FIG. 26 is a flow chart of illustrative steps involved in preloading data into the registers of the FIG. 24 arrangement and observing logic signals from those registers in accordance with the present invention.

Steps involved in preloading registers 338 and in observing signals from registers 338 are shown in FIG. 26. At step 362, FIFO chains 358 are loaded so that the preload data intended for registers 338 is loaded into the appropriate shadow memory cells 340. At step 364, the register clock signals applied to clock terminals 352 are taken to an active state and suitable register clear signals are applied to clear terminals 354 to turn off the register clear functions of registers 338 while combinatorial logic on the programmable logic device is being reset. At step 366, preload lines 348 are taken high globally, so that the data from shadow memory cells 340 is applied to the FB terminals of registers 338 to initialize registers 338. At step 368, the FIG. 24 arrangement is taken into user mode by driving preload lines 348 low, releasing the combinatorial logic that is supplying data signals to data inputs 370, and releasing the register clock and clear signals.

After the device has been operated in user mode, the user may observe the logic signals at a desired point in time by freezing the clock signals applied to clock terminals 352 at step 372. Load lines 344 and address lines 350 are then globally taken high at step 374 to load the logic signals from registers 338 into FIFO shadow memory cells 340. At step 376, shadow address lines 350 are turned off to isolate shadow memory cells 340 from the rest of the cells 356 in chains 358. At step 378, load lines 344 are taken low to turn off load transistors 342 and thereby isolate shadow memory cells 340 from registers 338. At step 380, the data in chains 358 (which includes the data to be observed from registers 338) may be unloaded for observation and analysis using test register 382. Data from test register 382 may be read out of the programmable logic device using the same type of circuitry normally used to read out test data from FIFO chain test registers on programmable logic devices without shadow memory cell capabilities.

Figure 27:
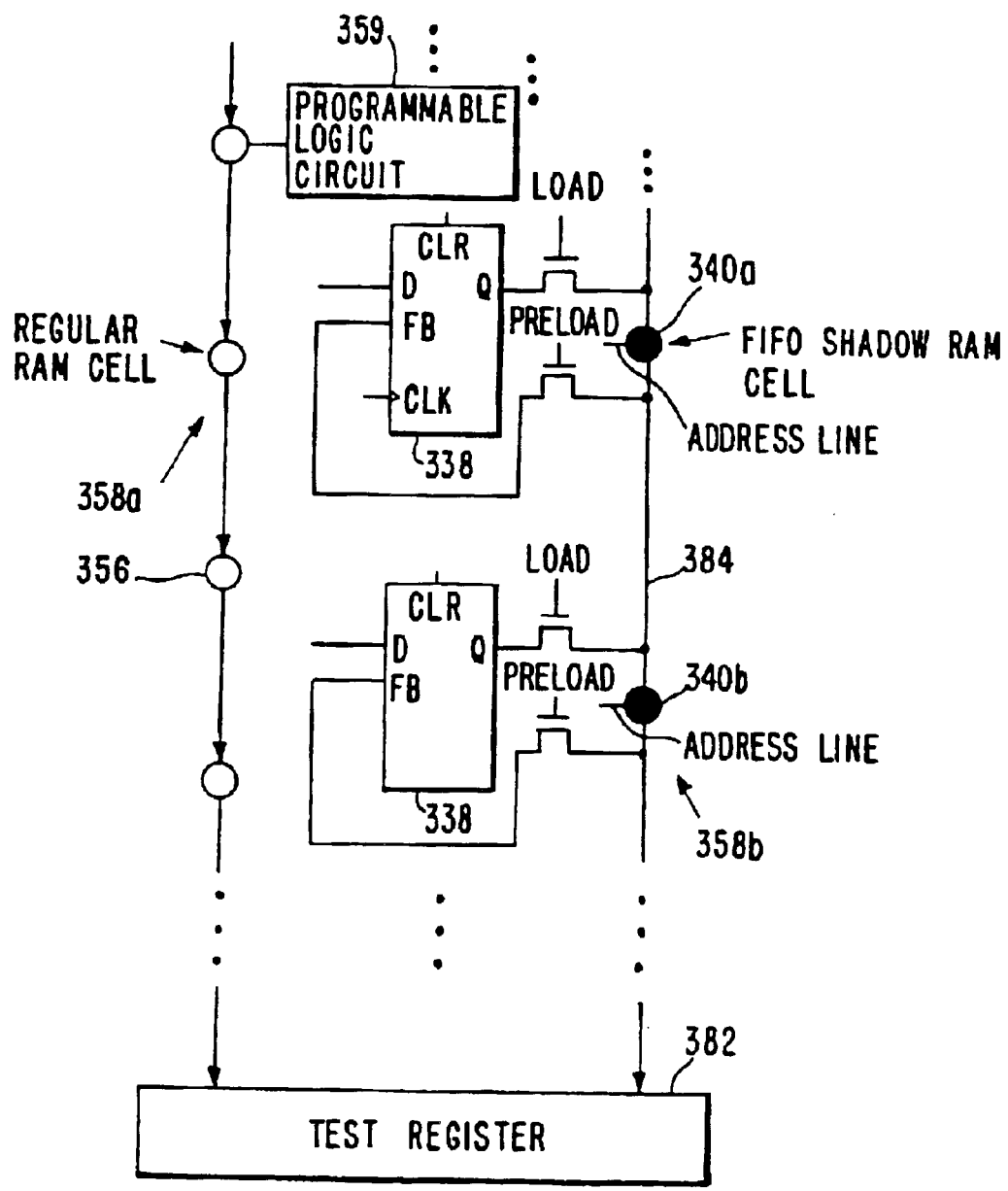
FIG. 27 is a diagram of illustrative circuitry in which a first-in-first-out chain having only shadow memory cells is used for observing logic signals from programmable logic circuits and for preloading preload data into the programmable logic circuits on a programmable logic device in accordance with the present invention.

As shown in FIG. 27, shadow memory cells 340 of FIG. 24 (or cells 310 of FIG. 22) may be arranged in a FIFO chain made up exclusively of shadow memory cells (e.g., shadow random-access memory cells). Shadow memory cell 340a is connected directly to shadow memory cell 340b by line 384, without any intervening regular FIFO memory cells 356. FIFO chain 358a is a regular FIFO chain and FIFO chain 358b is a shadow memory cell FIFO chain. Data from chains 358a and 358b may be read out using test register 382. The data read out from chain 358a is programming data that is normally applied to programmable logic circuits such as programmable logic circuit 359 of FIG. 27. Data is typically read out from chain 358a during testing. The data read out from chain 358b is the data from logic element registers 338 that is to be observed.

In the arrangements of FIGS. 22–27, the load transistors may be controlled globally by a single load control signal and the preload transistors may be controlled globally by a single preload control signal.

Figure 28:
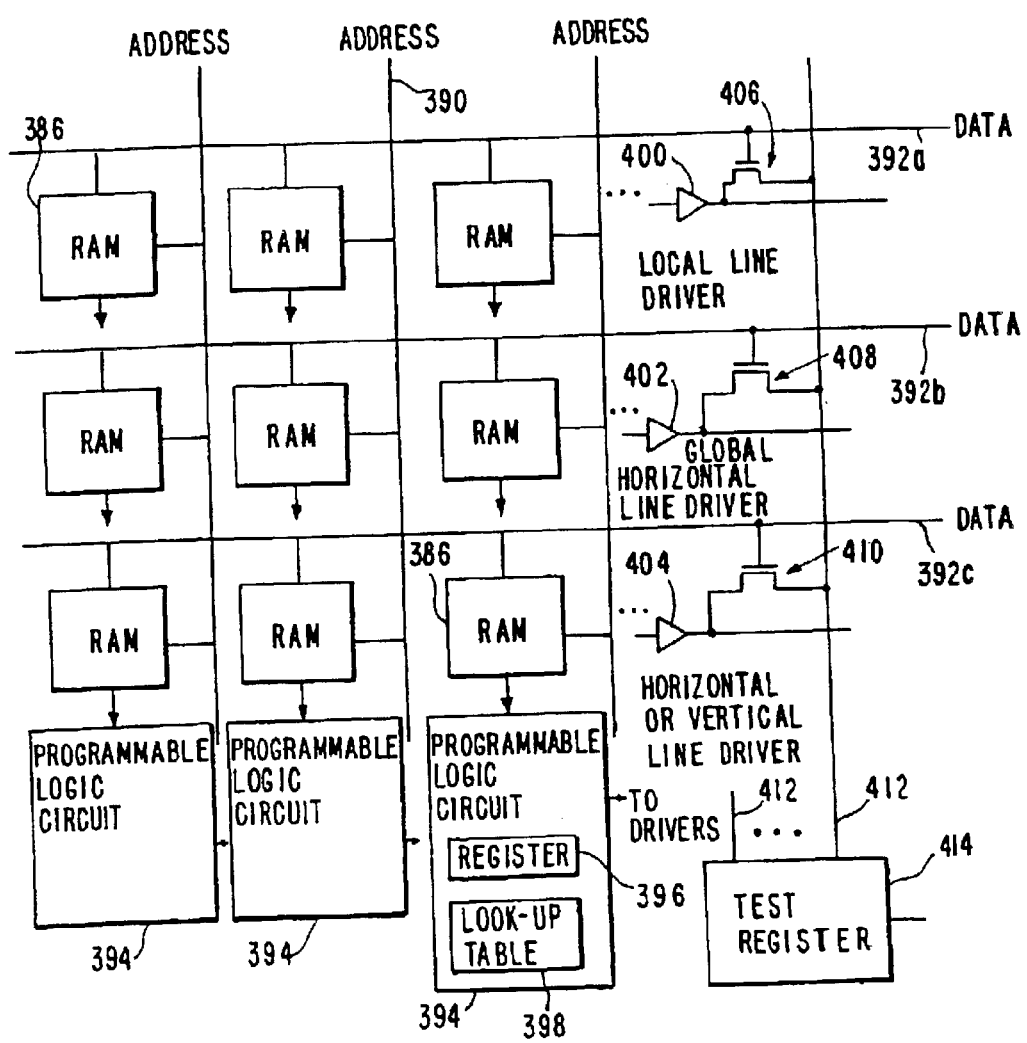
FIG. 28 is a diagram of illustrative circuitry for observing logic signals from programmable logic circuits in which the data lines that are used for providing data to an array of programming memory cells are also used to control access transistors that are connected between drivers associated with the programmable logic circuits and various debug output lines in accordance with the present invention.

Another aspect of the invention relates to observing signals in programmable logic devices in which the configuration bits for the programmable logic circuits on the device are arranged in an array. As shown in FIG. 28, configuration random-access memory cells 386 are arranged in an array 388. Memory cells 386 can be selectively programmed with programming data using address lines 390 to address the memory cells and data lines 392 to supply the programming data to the memory cells. The programing data stored in memory cells 386 is applied to associated programmable logic circuits such as programmable logic circuits 394 for configuring the programmable logic within circuits 394. Programmable logic circuits 394 may each contain a register 396 and a look-up table 398 or any other suitable logic. Only a few programmable logic circuits 394 are shown in FIG. 28 to avoid over-complicating the drawing, but there are generally a number of such programmable logic circuits and each memory cell 386 typically applies its output to one of those circuits.

Figure 29:
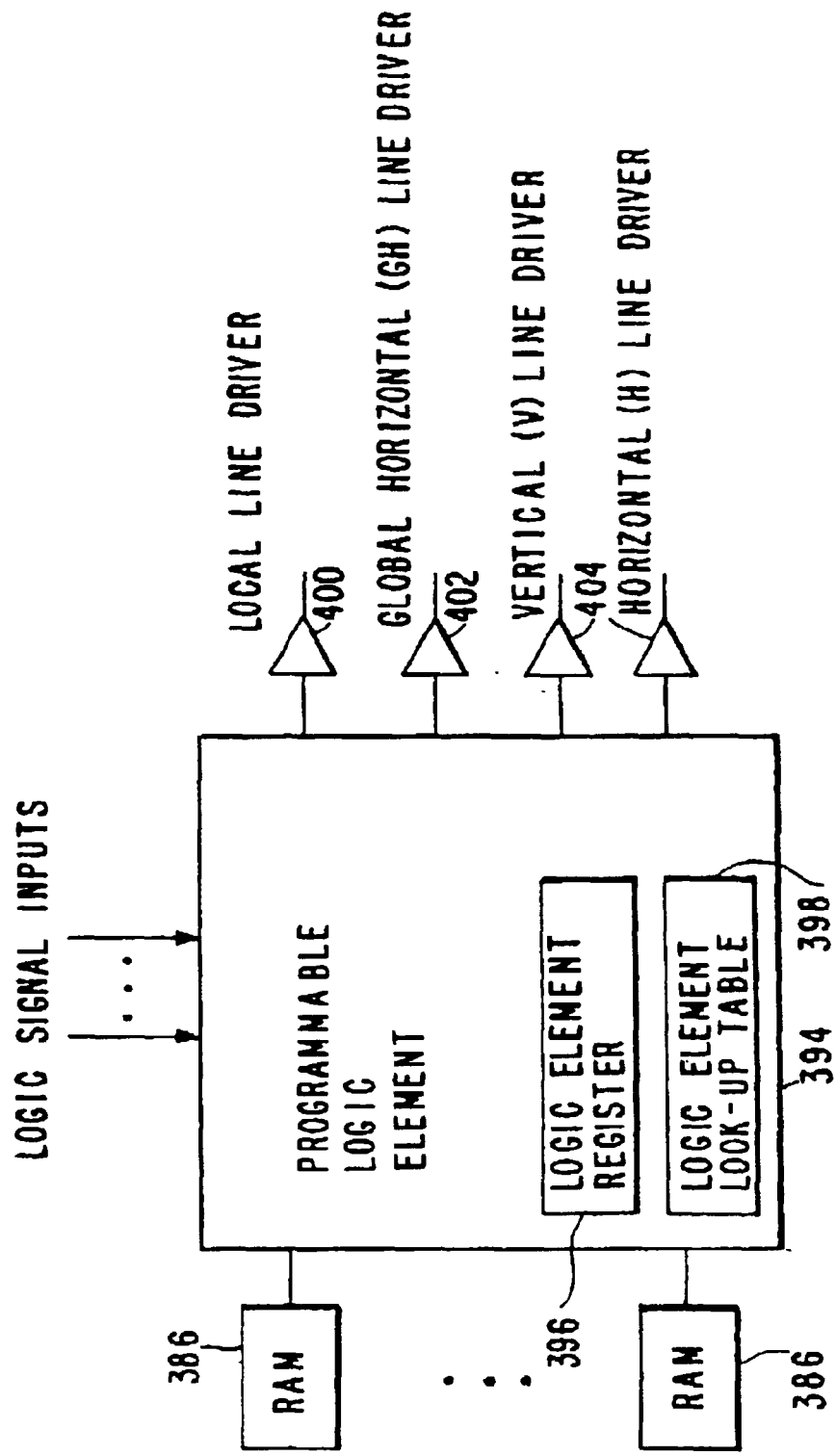
FIG. 29 is a diagram of illustrative programmable logic element circuitry that may be used for the programmable logic circuits of FIG. 28 in accordance with the present invention.

As shown in FIG. 29, programmable logic circuits 394 may be logic elements such as logic elements 12 of FIG. 1, which may be configured using multiple memory cells 386 and which may be organized in logic array blocks 18 and groups of logic array blocks 22 that are interconnected by various conductors.

The outputs of programmable logic circuits 394 are applied to interconnect drivers such as local line driver 400 for driving local lines 20 of FIG. 1, global horizontal line driver 402 for driving global horizontal lines 24 of FIG. 1, and horizontal or vertical lines drivers such as driver 404 for driving vertical lines 26 and horizontal lines 28 of FIG. 1.

During programming of a programmable logic device that contains the circuitry of FIG. 28, address lines 390 and data lines 392 are used to selectively direct programming data into the desired memory cells 386. When it is desired to observe signals from programmable logic circuits 394, data lines 392 (which would not otherwise be used) may be used to selectively turn on pass transistors such as pass transistors 406, 408, and 410. This allows data from programmable logic circuits 394 to be observed with debug output lines 412 and test register 414. Only one debug output line 412 is shown connected to drivers in FIG. 28 to avoid overcomplicating the drawing. However, each debug output line 412 is generally connected to its own set of output drivers. By latching signals from a number of debug output lines 412 at the same time, test register 414 allows signals to be rapidly read from, for example, a row of programmable logic circuits 394.

In the arrangement of FIG. 28, an output signal from local line driver 400 may be observed by taking data line 392a high to turn on pass transistor 406, a signal from global horizontal line driver 402 may be observed by taking data line 392b high to turn on pass transistor 408, and a signal from a vertical or horizontal line driver 404 may be observed by taking data line 392c high to turn on pass transistor 410. Because the inputs to drivers 400, 402, and 404 are typically the outputs of registers 396 and look-up tables 398, both registered and combinatorial programmable logic circuit signals may be observed using the arrangement of FIG. 28. The tap points illustrated in FIG. 28 (i.e., the outputs of drivers 400, 402, and 404) are illustrative only. Logic signals from programmable logic circuits may be observed at any other suitable tap points if desired.

Figure 30:
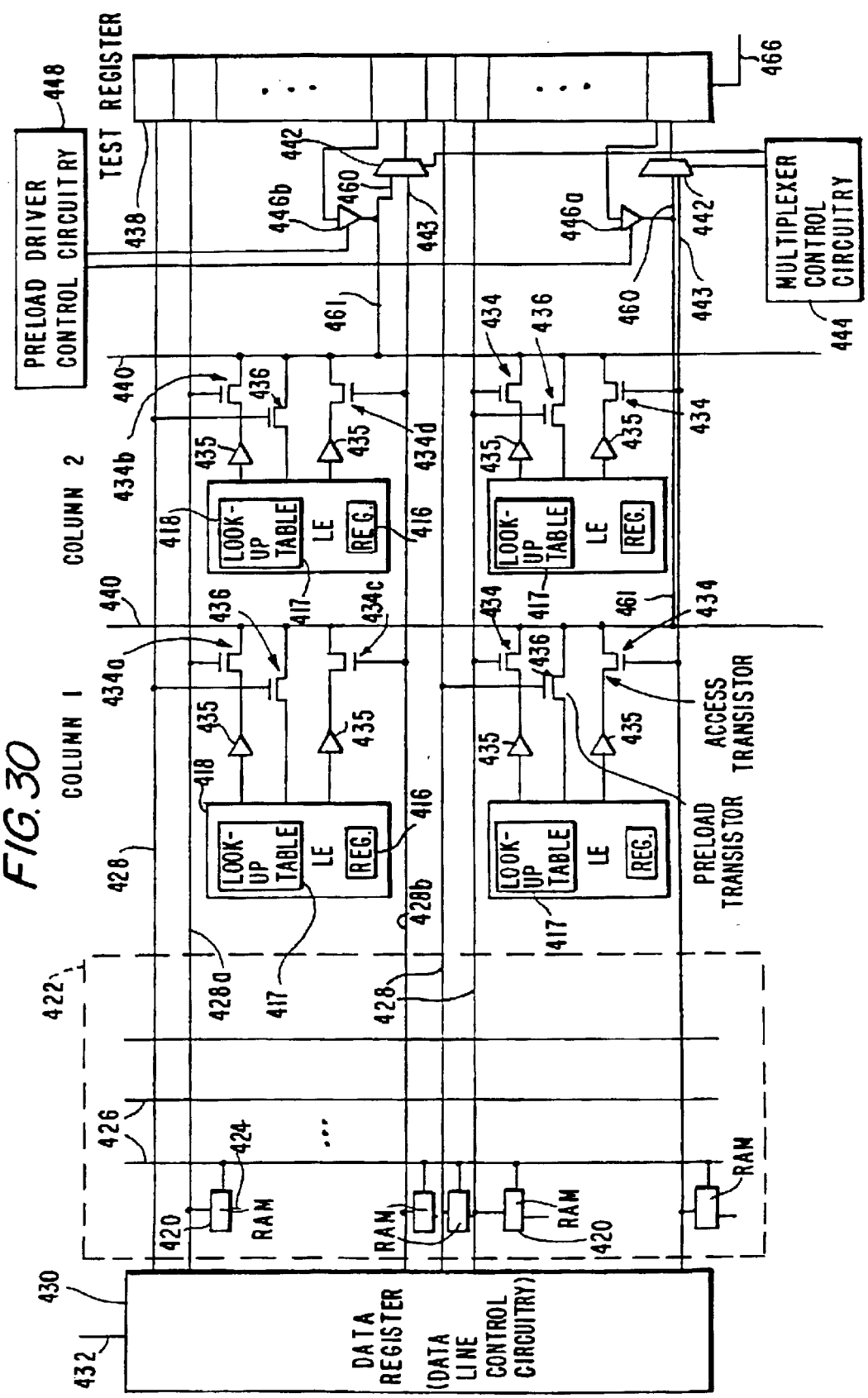
FIG. 30 is a diagram of illustrative circuitry for observing logic signals from programmable logic circuits arranged in an array with associated data lines and sense lines in accordance with the present invention.

The arrangement of FIG. 30 allows data to be simultaneously preloaded into multiple registers or simultaneously unloaded from multiple registers. Multiple rows of logic element registers 416 in logic elements 418 can be addressed simultaneously using data lines 428. Logic elements 418 may be logic elements such as logic elements 12 of FIG. 1 or any other suitable type of programmable logic circuit. In the FIG. 30 arrangement, configuration RAM cells 420 are organized in an array 422. The outputs 424 of cells 420 are applied to logic elements 418 to configure programmable logic in logic elements 418. Columns of memory cells 420 (only one of which is shown in FIG. 30 to avoid overcomplicating the drawing) are associated with address lines 426. Rows of memory cells 420 are associated with data lines 428. Memory cells 420 are addressed with address lines 426 while appropriate programming data is supplied using data register 430 (i.e., data line control circuitry) and data lines 428. The programming data supplied by data register 430 may be received at data register input 432. (Circuitry similar to data register 430 is used to control data lines 392 in the FIG. 28 arrangement).

Each logic element 418 has associated access transistors 434 and buffers 435 for unloading data from logic elements 418 that is to be observed. Access transistors 434 are controlled by associated data lines 428. Logic signals from logic elements 418 that are to be observed may be provided to test register 438 via sense lines 440, access lines 461, and multiplexers 442. Multiplexers 442 are controlled by multiplexer control circuitry 444.

Each logic element 418 also has associated preload transistors 436 for preloading test data into logic elements 418. Preload data that is supplied to test register 438 may be preloaded into logic elements 418 (e.g., into registers 416) using write drivers 446 and preload transistors 436. Write drivers 446 are controlled by preload driver control circuitry 448. Write driver 446a serves the logic elements 418 in column 1 and write driver 446b serves the logic elements 418 in column 2.

Figure 31:
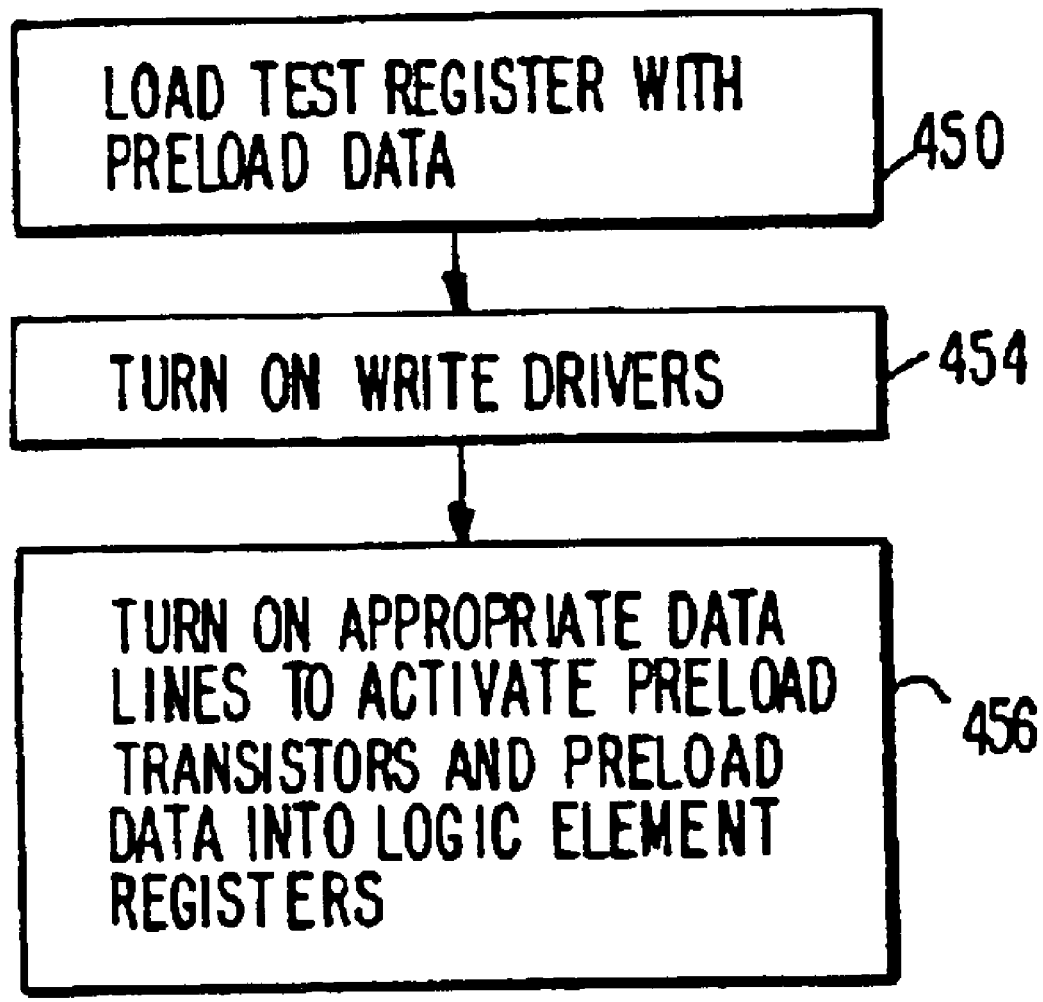
FIG. 31 is a flow chart of illustrative steps involved in preloading data into the programmable logic circuits of FIG. 30 in accordance with the present invention.

Steps involved in preloading data are shown in FIG. 31. At step 450, preload data is loaded into test register 438 (e.g., by shifting this data into test register 438 via data lines 428 while multiplexer control circuitry 444 directs multiplexers 442 to connect their data line inputs 443 to their outputs). At step 454, preload driver control circuitry 448 turns on one of preload drivers 446, thereby applying the associated preload data in test register 438 to the preload transistors 436 in a desired one of the columns of logic elements 418. At step 456, data line control circuitry 430 activates one or more data lines 428 to turn on associated preload transistors 436 and thereby allow the preload data that is being provided at the output of the turned-on preload driver 446 to be preloaded into the logic elements 418 serviced by those preload transistors 436. If desired, an entire column of logic elements 418 may be preloaded with data at the same time by activating all of the data lines 428 associated with preload transistors 436. Alternatively, one or more (but fewer than all) logic elements 418 in that column may be preloaded by activating fewer of the data lines 428 associated with preload transistors 436. All logic elements 418 can be programmed with desired preload data by systematically progressing through all logic elements during preloading.

Figure 32:
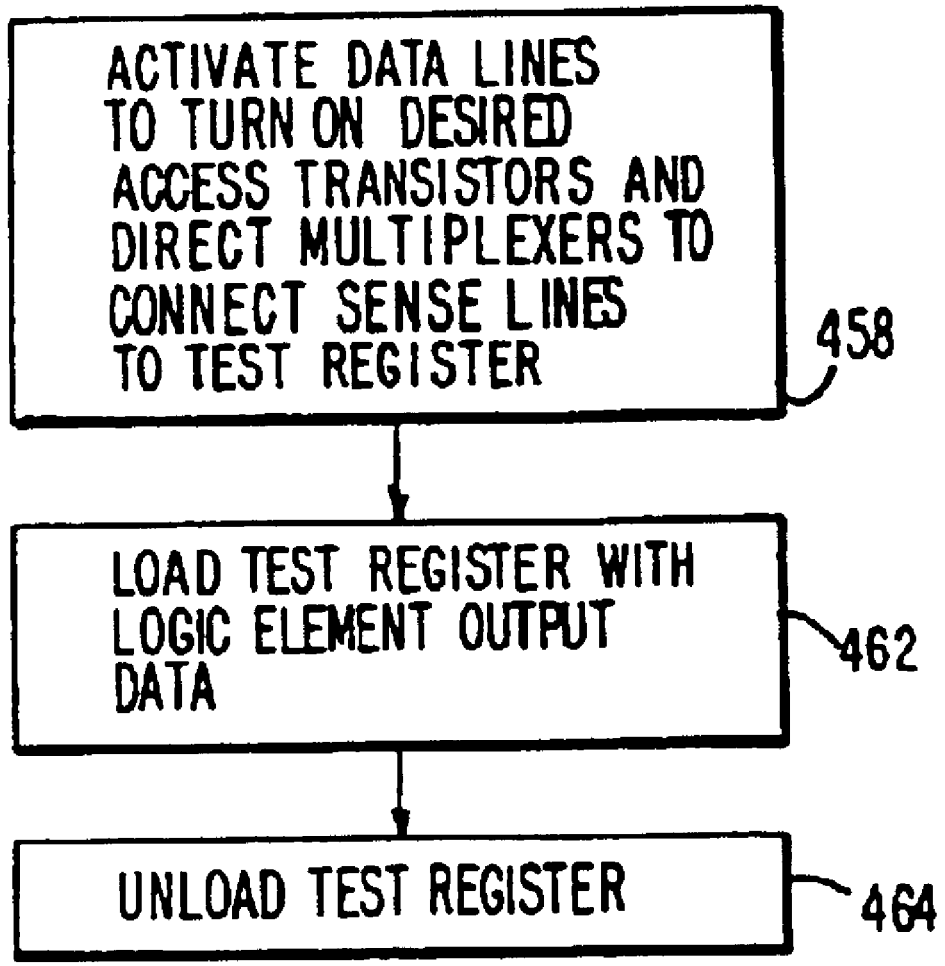
FIG. 32 is a flow chart of illustrative steps involved in observing logic signals from the programmable logic circuits of FIG. 30 in accordance with the present invention.

Steps associated with unloading logic signal data from logic elements 418 to be observed are shown in FIG. 32. At step 458, data line control circuitry 430 is used to activate certain desired access transistors 434. Although each logic element 418 may have more than one output connected to a respective driver 435 (e.g., one registered logic element output and one combinatorial logic element output), only one data line 428 associated with a given logic element 418 may be activated at a time to avoid contention between drivers. For example, data line 428a may be activated to turn on access transistors 434a and 434b (e.g., to observe registered signals) or data line 428b may be activated to turn on access transistors 434c or 434d (e.g., to observe combinatorial signals derived from look-up tables 417), but data lines 428a and 428b may not be activated simultaneously when observing logic element signals. In addition, data lines 428 in different rows of logic elements may not be activated at the same time when observing logic element signals.

When a data line 428 in a given row is activated, all of the associated access transistors 434 in that row are turned on, so that logic signals from each of the logic elements 418 in that row are provided to test register 438 via associated sense lines 440 and associated access lines 461. The FIG. 30 arrangement allows data signals for all of the logic elements 418 in a row to be observed simultaneously. Signals for the logic elements 418 in all rows may be observed by progressively activating an appropriate data line 428 in each row of logic elements.

At the same time that the various data lines are activated at step 458 of FIG. 32, multiplexer control circuitry 444 directs each multiplexer 442 to connect its access line input 460 to its output. This ensures that logic signals from the logic elements 418 are directed to and loaded into test register 438 at step 462. Test register 438 may be unloaded via output 466 at step 464.

Multiplexers 442 may be directed to connect their data line inputs 443 to their outputs by multiplexer control circuitry 444 when it is desired to read data from memory cells 420. The use of multiplexers 442 in the arrangement of FIG. 30 therefore allows test register 438 to be connected to all of data lines 428, so that data may be received from all of the rows of array 422.

Figure 33:
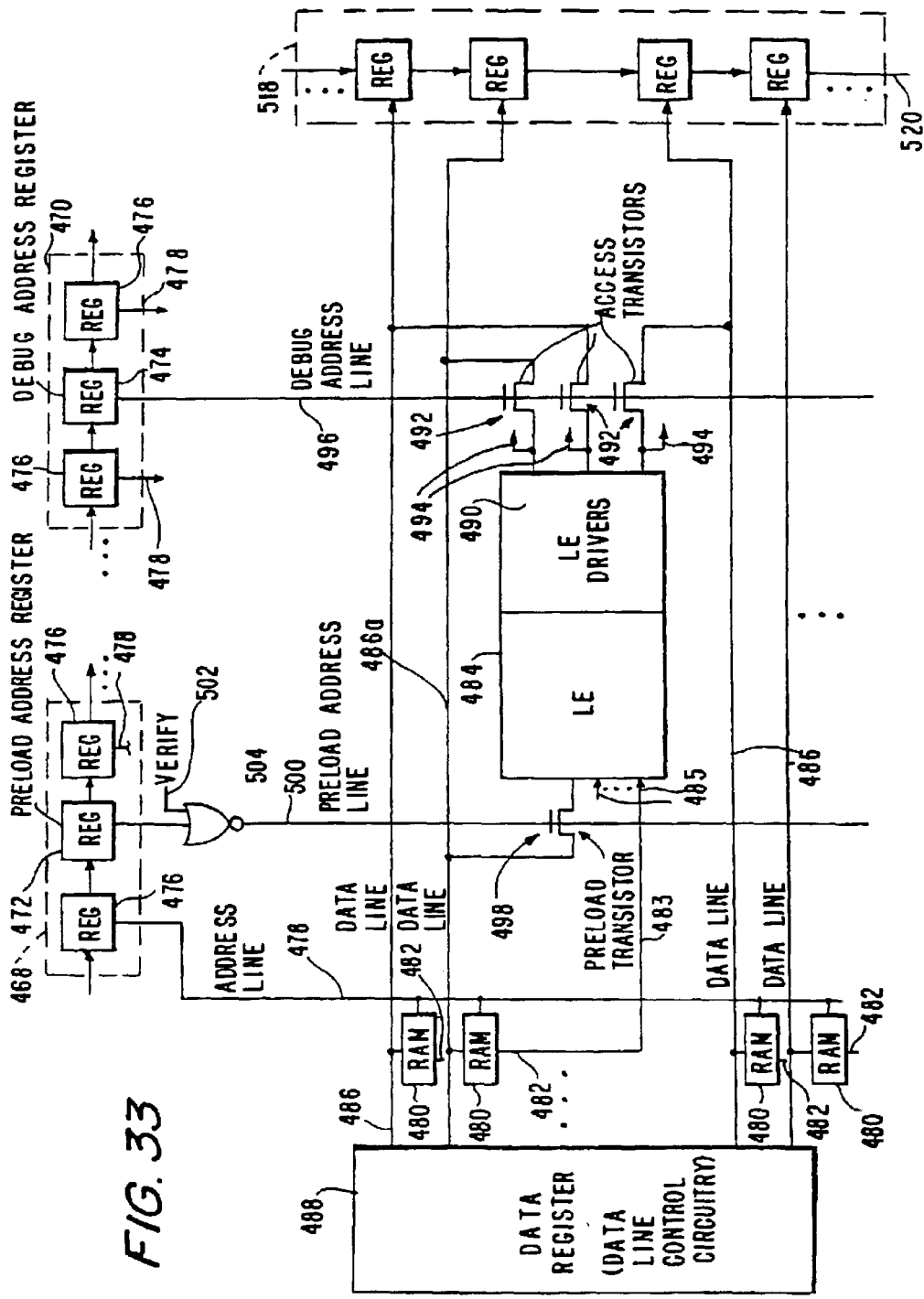
FIG. 33 is a diagram of illustrative circuitry for observing programmable logic circuit logic signals on a programmable logic device in which access transistors are controlled by signals stored in debug address registers that are part of a chain of memory cell address registers in accordance with the present invention.

As shown in FIG. 33, the logic signals from a programmable logic circuit on a programmable logic device may be observed using special address registers to address the appropriate preload and access transistors. In the FIG. 33 arrangement, chains of address registers 468 and 470 contain preload address registers such as preload address register 472 and debug address registers such as debug address register 474.

The normal address registers 476 in chains 468 and 470 are connected to address lines 478, which are associated with columns of memory cells 480. The outputs 482 of memory cells 480 are applied to programmable logic circuits to configure programmable logic within those circuits (e.g., by lines such as line 483 that are connected to inputs 485). Programmable logic elements such as programmable logic element 484 may use the arrangement of programmable logic elements 12 of FIG. 1. There are preferably numerous programmable logic elements 484 on a given programmable logic device that uses the FIG. 33 arrangement. Such programmable logic elements 484 are preferably arranged in columns and rows within logic array blocks similar to logic array blocks 22 of FIG. 1. Only a single logic element 484 is shown in FIG. 33 to avoid over-complicating the drawing. Address lines 478 and data lines 486 are used to selectively store programming data provided by data register 488 (data line control circuitry) in memory cells 480.

Each logic element 484 has associated logic element drivers 490 for driving logic element output signals onto conductors such as local lines 20, global horizontal lines 24, vertical lines 26, and horizontal lines 28 of FIG. 1 via logic element driver outputs 494. Access transistors 492 are controlled by debug address register 474 using debug address line 496. Preload transistor 498 is controlled by preload address register 472 using preload address line 500. Verify line 502 and verify control logic 504 (e.g., a NOR gate) may be used to selectively control the application of output signals from preload address register 472 to preload address line 500 and therefore preload transistor 498. Multiple logic elements 484 may be organized in, e.g., columns, so that a single preload address line may be used to control the preload transistors of multiple logic elements 484. Similarly, each debug address line 496 may be used to control the access transistors 492 of multiple logic elements 484.

Figure 34:
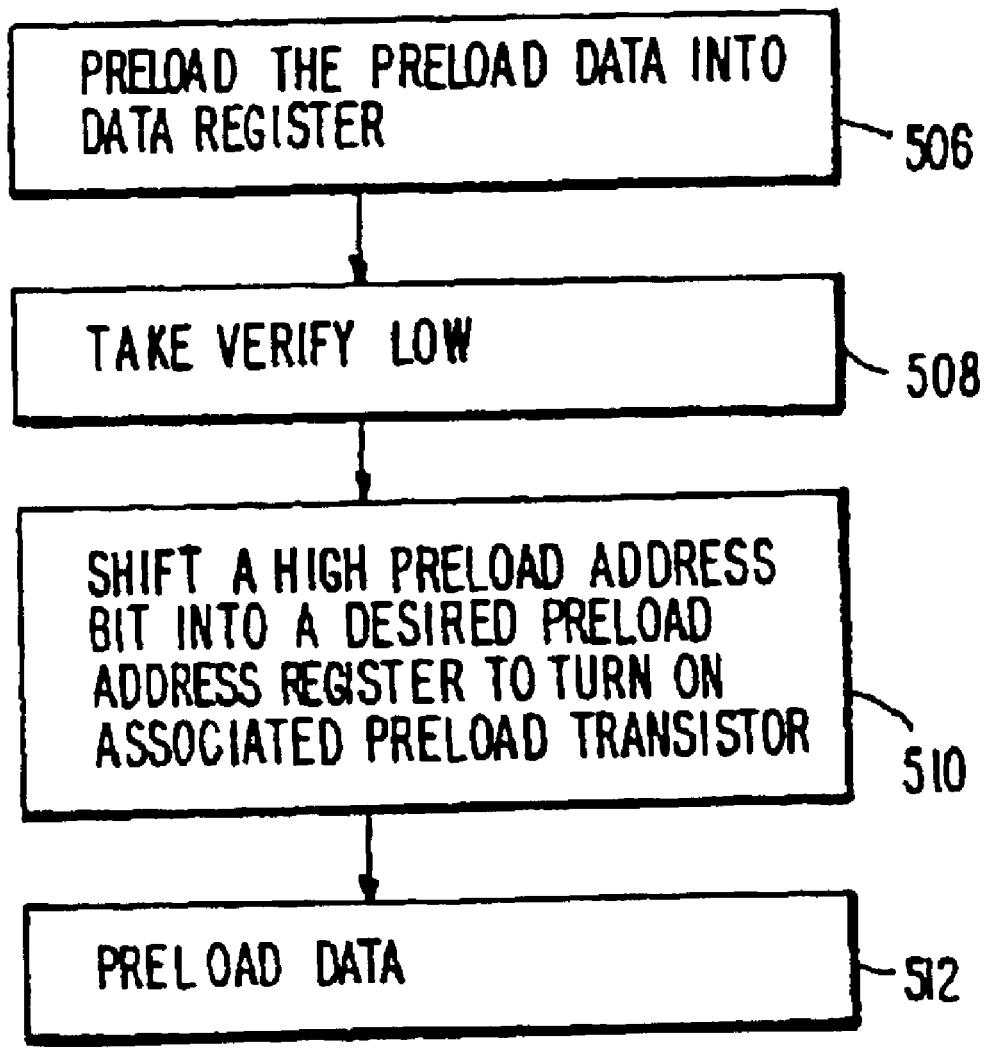
FIG. 34 is a flow chart of illustrative steps involved in preloading data into the programmable logic circuits of FIG. 33 in accordance with the present invention.

Steps involved in preloading data into logic element 484 are shown in FIG. 34. At step 506, preload data is preloaded into data register 488. At step 508, verify line 502 is taken low, thereby enabling verify control logic 504, so that the output signal of preload register 472 may be passed to preload transistor 498. At step 510, a high preload address bit is shifted through address register chain 468 into the desired preload address register 472. This turns on associated preload transistor 498, so that data applied to data line 486a by data register 488 is preloaded into logic element 484 at step 512.

Figure 35:
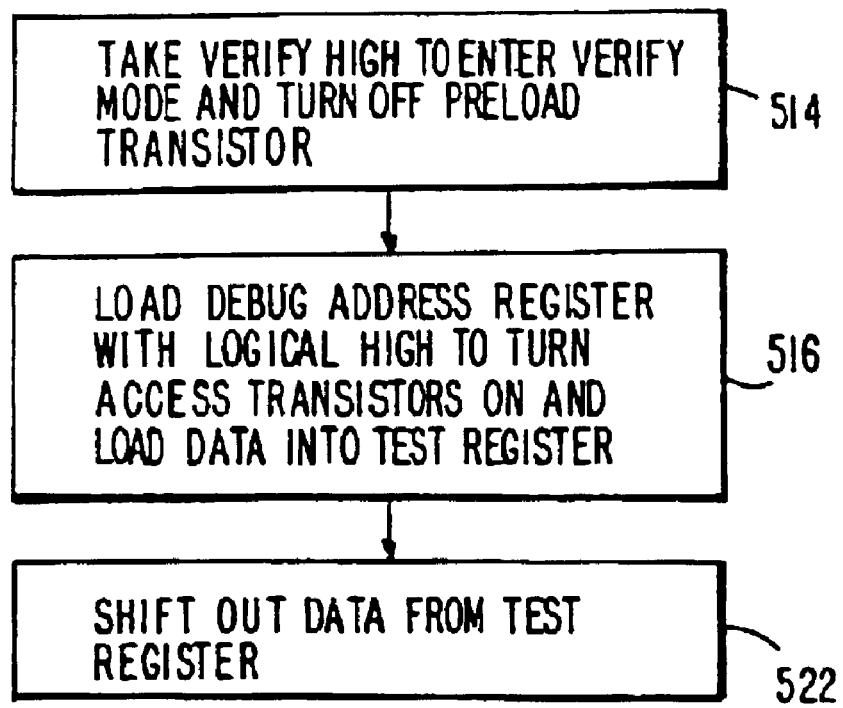
FIG. 35 is a flow chart of illustrative steps involved in observing logic signals from the programmable logic circuits of FIG. 33 in accordance with the present invention.

Steps involved in observing the logic element output signals at logic element driver outputs 494 are shown in FIG. 35. At step 514, verify line 502 is taken high to turn preload transistor 498 off. At step 516, a high debug address bit is shifted through address register chain 470 (which may be separate from or connected to chain 468) into the desired debug address register 474. This turns on associated access transistors 492 so that data from outputs 494 is loaded into test register 518 via data lines 486. The logic element output signal data may be shifted out of test register 518 via output 520 for observation and analysis at step 522.

Figure 36:
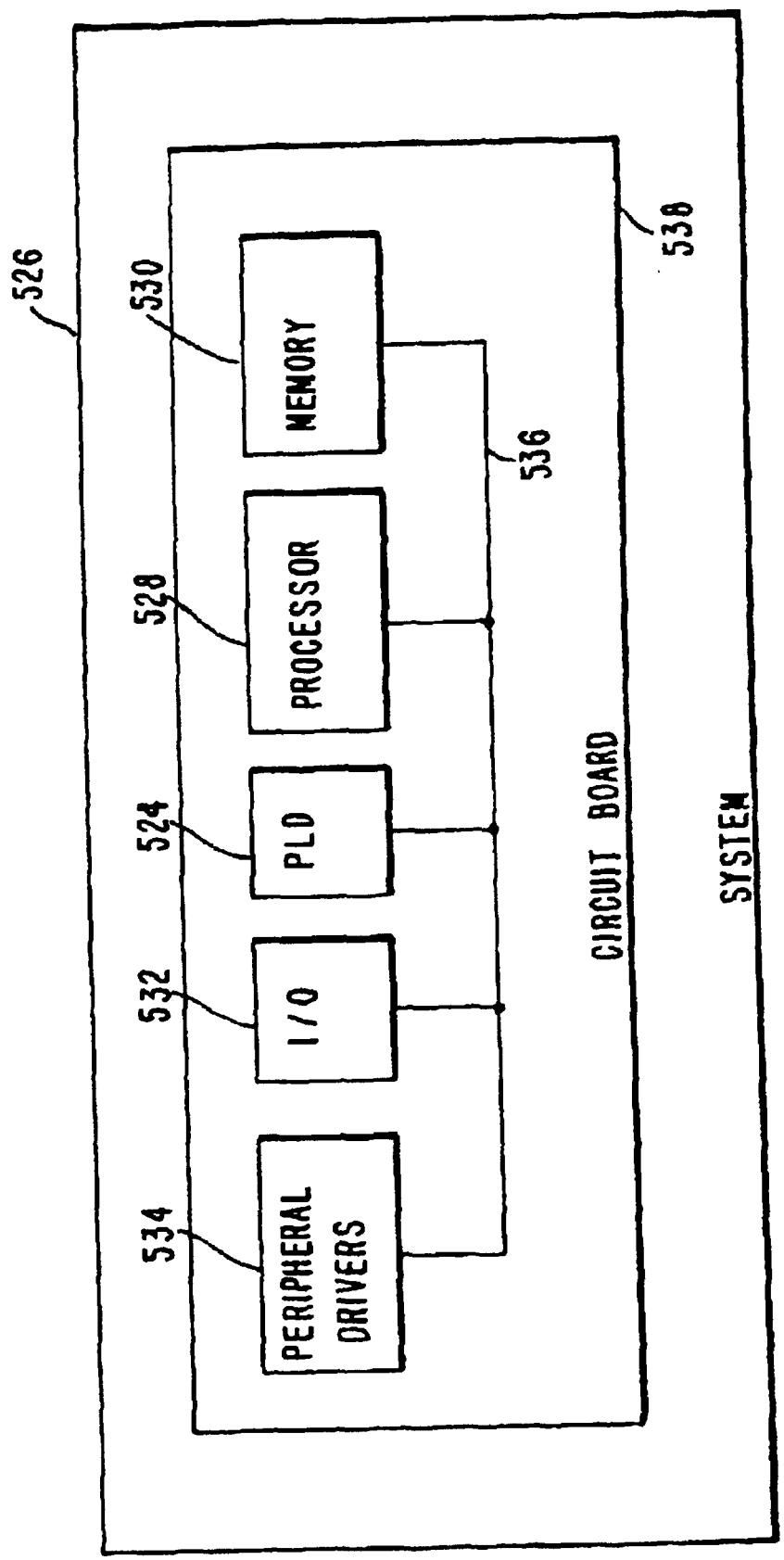
FIG. 36 is a diagram of an illustrative system in which the programmable logic device arrangements of the present invention may be used.

The foregoing arrangements are typically used in programmable logic devices that are made part of larger systems. FIG. 36 shows a programmable logic device 524 containing circuitry such as the preloading and data signal observing circuitry of this invention in use in a data processing system 526. Data processing system 526 may include one or more of the following components: a processor 528, memory 530, I/O circuitry 532, and peripheral drivers 534. These components are coupled together by a system bus 536 and populate a circuit board 538 that is contained in system 526.

System 526 may be used in a wide variety of applications, such as computer networking, data networking, instrumentation, video processing, digital signal processing, or any other application where the advantage of using programmable logic is desirable. Programmable logic device 524 may be used to perform a variety of different logic functions. For example, programmable logic device 524 may be configured as a processor or controller that works in cooperation with processor 528. Programmable logic device 524 may also be used as an arbiter for arbitrating access to a shared resource in system 526. In yet another example, programmable logic device 524 may be configured as an interface between processor 528 and one of the other components in system 526.

The programmable connections made between various components and used in configuring the programmable logic circuits in the programmable logic devices of the present invention can be implemented in any of a wide variety of ways. For example, each programmable connection can be a relatively simple programmable connector such as a switch or a plurality of switches for connecting any one of several inputs to an output. Each such connection may be configured using a memory cell such as a random-access memory cell. Alternatively, programmable connectors can be somewhat more complex elements which are capable of performing logic (e.g., by logically combining several of their inputs) as well as making connections. For example, each programmable connection can use product term logic, implementing functions such as AND, NAND, OR, or NOR. Examples of components suitable for implementing programmable connections are erasable programmable read-only memories (EPROMs), electrically-erasable programmable read-only memories (EEPROMs), pass transistors, transmission gates, antifuses, laser fuses, metal optional links, etc. These programmable components may be controlled by various programmable function control elements or memory cells, which store the configuration data used to control the programmable components. Examples of suitable function control elements include static random-access memory (SRAM) cells, dynamic random-access memory (DRAM)

cells, first-in first-out cells, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

The foregoing is merely illustrative of the principles of this invention and various modifications can be made by those skilled in the art without departing from the scope and spirit of the invention.

What is claimed is:

1. A method for observing logic element signals in a programmable logic device having a plurality of logic elements, a plurality of logic element registers, each contained in a respective one of the logic elements and each having a logic element register output, logic element logic in each logic element that provides logic signals, a switching circuit associated with each logic element that has a logic element input connected to the logic element logic for receiving the logic signals, a scan chain input, and a switching circuit output for providing signals to the logic element register contained in that logic element, and a plurality of scan chain conductors each connecting the logic register output of a logic register in one of the logic elements to the scan chain input of the switching circuit associated with a successive one of the logic elements to form a continuous scan chain, the method comprising the steps of:

configuring the switching circuits during normal operation to connect their logic element inputs to their outputs so that the logic signals are stored in the logic element registers; and configuring the switching circuits during register observation to connect their scan chain inputs to their outputs so that the logic signals stored in the registers may be scanned out of the registers through the continuous scan chain.

2. The method defined in claim 1 wherein the programmable logic device further comprises an input coupled to the scan chain input of one of the switching circuits, the method further comprising the step of using the input to supply initialization data to the registers through the scan chain.

3. The method defined in claim 2 wherein the input is a JTAG TDI input, the method further comprising the step of using the JTAG TDI input to supply initialization data to the registers through the scan chain.

4. The method defined in claim 1 wherein the programmable logic device further comprises at least one memory block, a plurality of memory block registers associated with the memory block, each memory block register having a memory block register output, a memory block switching circuit associated with each memory block register that has at least one memory block switching circuit input for receiving memory block signals, a memory block scan chain input, and a memory block switching circuit output for providing signals to the associated memory block register, and a plurality of memory block scan chain conductors each connecting the memory block register output of one of the memory block registers to the memory block scan chain input of a memory block switching circuit associated with a successive one of the memory block registers to form a continuous scan chain, the method further comprising the steps of:

configuring each memory block switching circuit during normal operation to connect its memory block switching circuit input to its memory block switching circuit output so that memory block signals are stored in the memory block registers; and configuring each memory block switching circuit during register observation to connect its memory block scan chain input to its memory block switching circuit output so that the memory block signals stored in the registers may be scanned out of the registers through the continuous scan chain.

5. The method defined in claim 4 further comprising the step of supplying initialization data to the memory block registers through the scan chain.

6. The method defined in claim 1 wherein the programmable logic device further comprises a JTAG TDO output coupled to the scan chain, the method further comprising the step of scanning out the logic signals stored in the registers through the JTAG TDO output.

7. The method defined in claim 1 wherein the programmable logic device further comprises a plurality of logic array blocks, each of which contains a number of the logic elements, the method further comprising the step of observing logic signals from the logic array blocks.

8. The method defined in claim 1 wherein the programmable logic device further comprises a plurality of logic array blocks, each of which contains a number of the logic elements, and a plurality of groups of logic array blocks, each of which contains a number of the logic array blocks, the method further comprising the step of scanning out logic signals from the logic elements in the groups of logic array blocks.

9. The method defined in claim 1 wherein the programmable logic device further comprises a plurality of logic array blocks, each of which contains a number of logic elements, and a plurality of groups of logic array blocks, each of which contains a number of the logic array blocks, the groups of logic array blocks being arranged in a plurality of rows, each row containing a corresponding set of switching circuits and scan chain conductors, the method further comprising the step of forming a separate scan chain of logic element registers in each row using the set of switching circuits and scan chain conductors in that row.

10. The method defined in claim 1 wherein the programmable logic device further comprises a plurality of logic array blocks, each of which contains a number of the logic elements, and a plurality of memory blocks, each of which contains a memory circuit, the method further comprising the step of observing logic signals from the memory blocks.

11. The method defined in claim 1 wherein the programmable logic device further comprises a plurality of logic array blocks, each of which contains a number of logic elements, a plurality of memory blocks, and a plurality of groups of logic array blocks each of which contains a number of the logic array blocks and one of the memory blocks, the method further comprising the step of observing logic signals from the groups of logic array blocks.

12. The method defined in claim 1 wherein the programmable logic device further comprises a plurality of logic array blocks, each of which contains a number of logic elements, and a plurality of memory blocks, each memory block having associated memory block registers, each memory block register having an associated memory block switching circuit and memory block scan chain conductor, and a plurality of groups of logic array blocks each of which contains a number of the logic array blocks and one of the memory blocks, the groups of logic array blocks being arranged in a plurality of rows, each row containing a corresponding set of switching circuits, memory block switching circuits, scan chain conductors, and memory block scan chain conductors, the method further comprising the step of forming a separate scan chain of logic element registers and memory block registers in each row using the set of switching circuits, memory block switching circuits, scan chain conductors, and memory block scan chain conductors in that row.

13. The method defined in claim 1 wherein each switching circuit has two logic element inputs, a scan chain input, and a switching circuit output, the method further comprising the step of observing logic signals from a selected one of the two logic element inputs.

14. The method defined in claim 1 further comprising the steps of:

providing the registers with initialization data through the scan chain during an initialization mode; and ensuring that data in the logic element registers is not corrupted during transitions between the initialization mode and normal operation.

* * * * *